(12) United States Patent
Choi et al.

(10) Patent No.: US 11,063,196 B2
(45) Date of Patent: Jul. 13, 2021

(54) SEMICONDUCTOR DEVICE AND SEMICONDUCTOR DEVICE PACKAGE

(71) Applicant: SUZHOU LEKIN SEMICONDUCTOR CO., LTD., Taicang (CN)

(72) Inventors: Byung Yeon Choi, Seoul (KR); Chang Hyeong Lee, Seoul (KR); Sung Min Hwang, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 0 days.

(21) Appl. No.: 16/480,924

(22) PCT Filed: Dec. 27, 2017

(86) PCT No.: PCT/KR2017/015516
§ 371 (c)(1),
(2) Date: Jul. 25, 2019

(87) PCT Pub. No.: WO2018/139770
PCT Pub. Date: Aug. 2, 2018

(65) Prior Publication Data
US 2019/0341536 A1    Nov. 7, 2019

(30) Foreign Application Priority Data

Jan. 26, 2017  (KR) ..................... 10-2017-0012804
Mar. 22, 2017  (KR) ..................... 10-2017-0036097

(51) Int. Cl.
*H01L 23/00* (2006.01)
*H01L 33/62* (2010.01)
(Continued)

(52) U.S. Cl.
CPC ............ *H01L 33/62* (2013.01); *B23K 35/262* (2013.01); *C22C 13/00* (2013.01); *H01L 24/29* (2013.01);
(Continued)

(58) Field of Classification Search
CPC ......... H01L 24/29; H01L 24/11; H01L 24/32; H01L 24/06; H01L 24/81; H01L 24/83; H01L 24/05
See application file for complete search history.

(56) References Cited

U.S. PATENT DOCUMENTS

2005/0139846 A1\* 6/2005 Park ...................... H01L 33/642
257/98
2005/0199904 A1\* 9/2005 Yamamoto .......... H01L 33/0093
257/103
(Continued)

FOREIGN PATENT DOCUMENTS

KR  10-2012-0041713 A  5/2012
KR  10-2012-0048330 A  5/2012
(Continued)

*Primary Examiner* — Khaja Ahmad
*Assistant Examiner* — Khatib A Rahman
(74) *Attorney, Agent, or Firm* — Birch, Stewart, Kolasch & Birch, LLP

(57) ABSTRACT

A semiconductor device according to the embodiment may include a light emitting structure including a first conductivity type semiconductor layer, a second conductivity type semiconductor layer; a first bonding pad disposed on the light emitting structure and electrically connected to the first conductivity type semiconductor layer; a second bonding pad disposed on the light emitting structure and spaced apart from the first bonding pad, and electrically connected to the second conductivity type semiconductor layer; and a reflective layer disposed on the light emitting structure and disposed between the first bonding pad and the second bonding pad. According to the semiconductor device of the (Continued)

embodiment, each of the first bonding pad and the second bonding pad includes a porous metal layer having a plurality of pores and a bonding alloy layer disposed on the porous metal layer.

13 Claims, 22 Drawing Sheets

(51) Int. Cl.
    *B23K 35/26*    (2006.01)
    *C22C 13/00*    (2006.01)
    *H01L 33/48*    (2010.01)
    *H01L 33/50*    (2010.01)
    *H01L 33/56*    (2010.01)
    *H01L 33/60*    (2010.01)

(52) U.S. Cl.
    CPC .......... *H01L 33/486* (2013.01); *H01L 33/502* (2013.01); *H01L 33/56* (2013.01); *H01L 33/60* (2013.01); *H01L 2224/29211* (2013.01); *H01L 2224/29239* (2013.01); *H01L 2224/29244* (2013.01); *H01L 2224/29247* (2013.01)

(56) References Cited

U.S. PATENT DOCUMENTS

| | | | |
|---|---|---|---|
| 2006/0157722 A1* | 7/2006 | Takezawa | H01L 33/60 257/98 |
| 2008/0116471 A1* | 5/2008 | Watanabe | H01L 33/10 257/98 |
| 2008/0164467 A1* | 7/2008 | Sano | H01L 33/0093 257/43 |
| 2008/0205013 A1* | 8/2008 | Oshika | H01L 24/83 361/767 |
| 2010/0044734 A1* | 2/2010 | Seko | H01L 33/46 257/98 |
| 2010/0203659 A1* | 8/2010 | Akaike | H01L 33/0093 438/29 |
| 2010/0227421 A1* | 9/2010 | Neff | H01L 33/62 438/26 |
| 2013/0001775 A1* | 1/2013 | Nishikubo | H01L 23/4924 257/737 |
| 2013/0134867 A1 | 5/2013 | Yang et al. | |
| 2013/0221372 A1 | 8/2013 | Lee et al. | |
| 2013/0244361 A1* | 9/2013 | Chinone | H01L 24/32 438/29 |
| 2014/0291021 A1* | 10/2014 | Yoshida | H01L 24/81 174/94 R |
| 2015/0380620 A1 | 12/2015 | Chae et al. | |
| 2016/0020374 A1* | 1/2016 | Aketa | H01L 33/54 257/91 |
| 2016/0218262 A1* | 7/2016 | Aketa | H01L 33/22 |
| 2016/0276558 A1* | 9/2016 | Kang | H01L 24/05 |
| 2017/0092820 A1* | 3/2017 | Kim, II | H01L 33/50 |

FOREIGN PATENT DOCUMENTS

| | | |
|---|---|---|
| KR | 10-2013-0053400 A | 5/2013 |
| KR | 10-2015-0066405 A | 6/2015 |
| KR | 10-2016-0081787 A | 7/2016 |

\* cited by examiner

[FIG. 1]
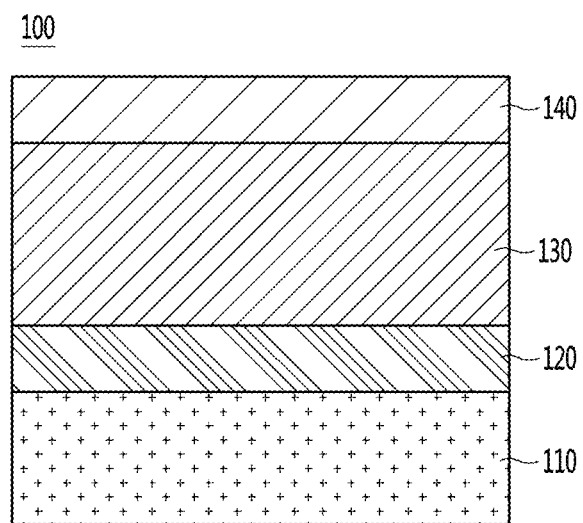

[FIG. 2]
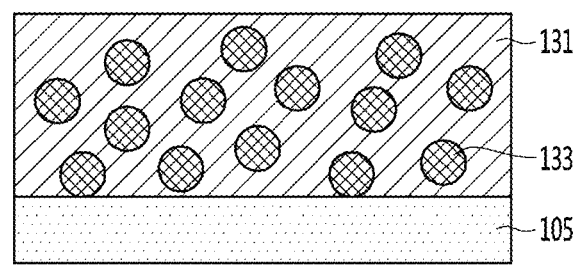

[FIG. 3]
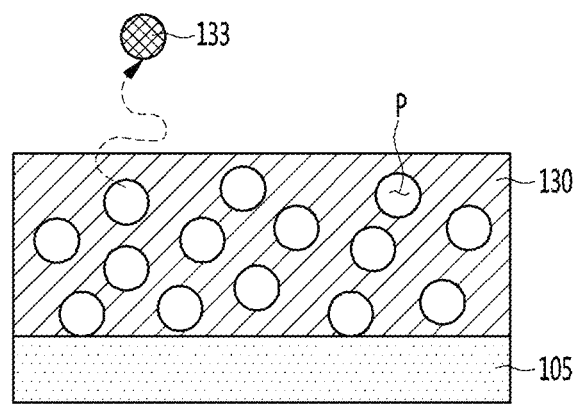

[FIG. 4]
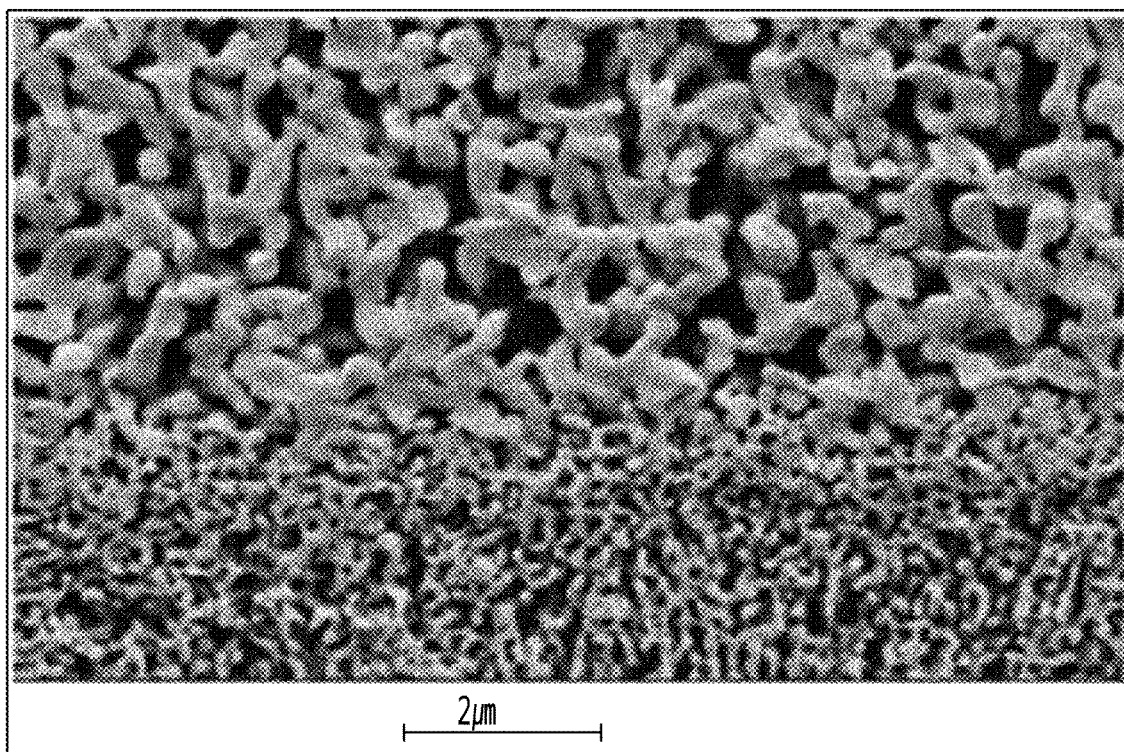

[FIG. 5]
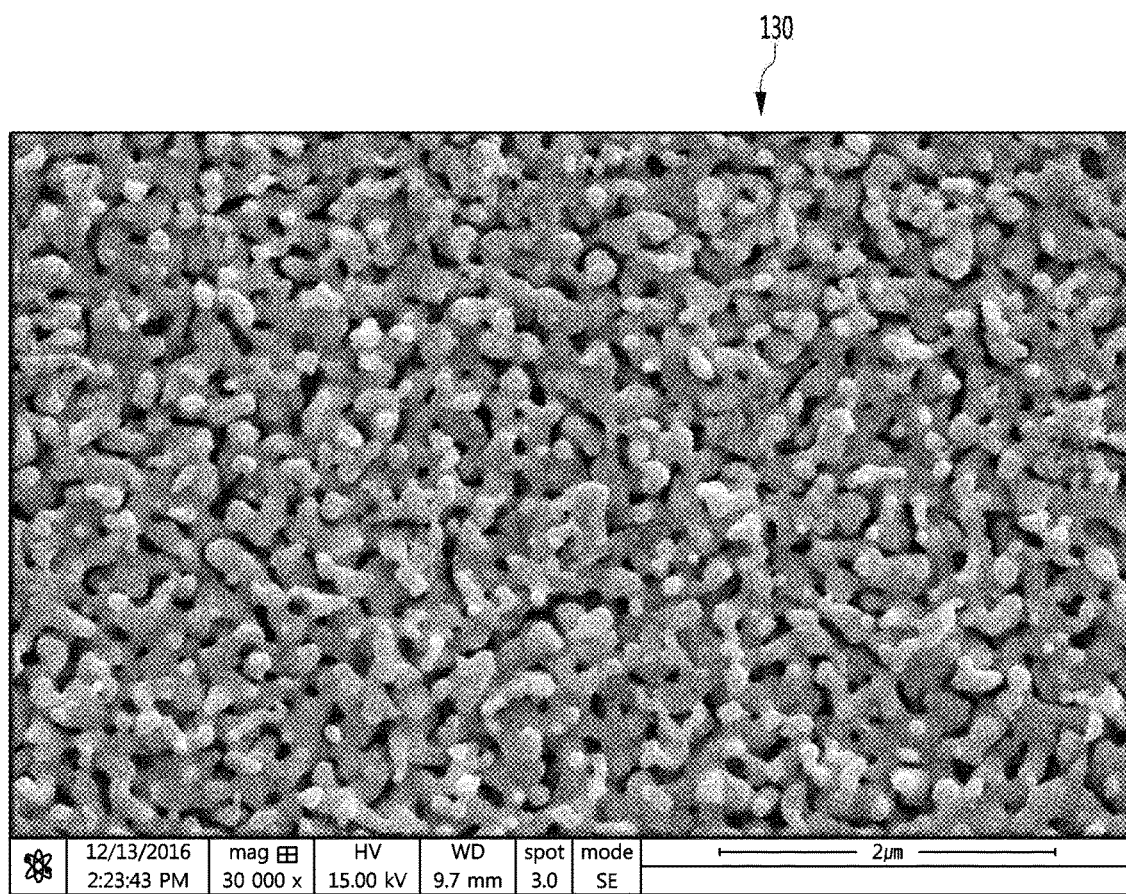

[FIG. 6]
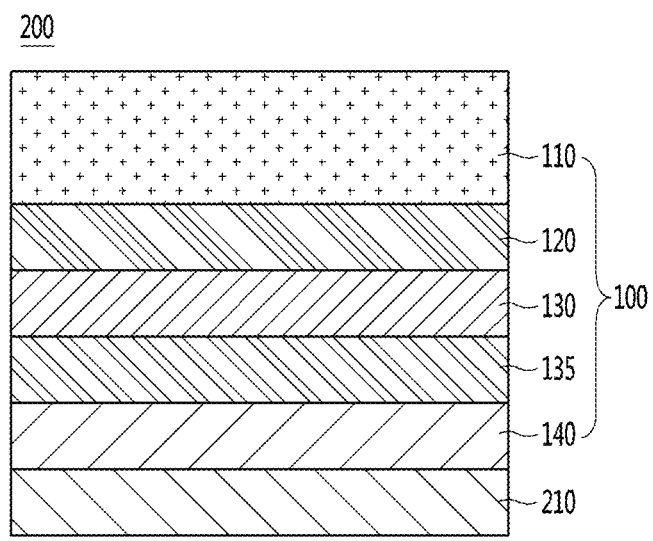

[FIG. 7]
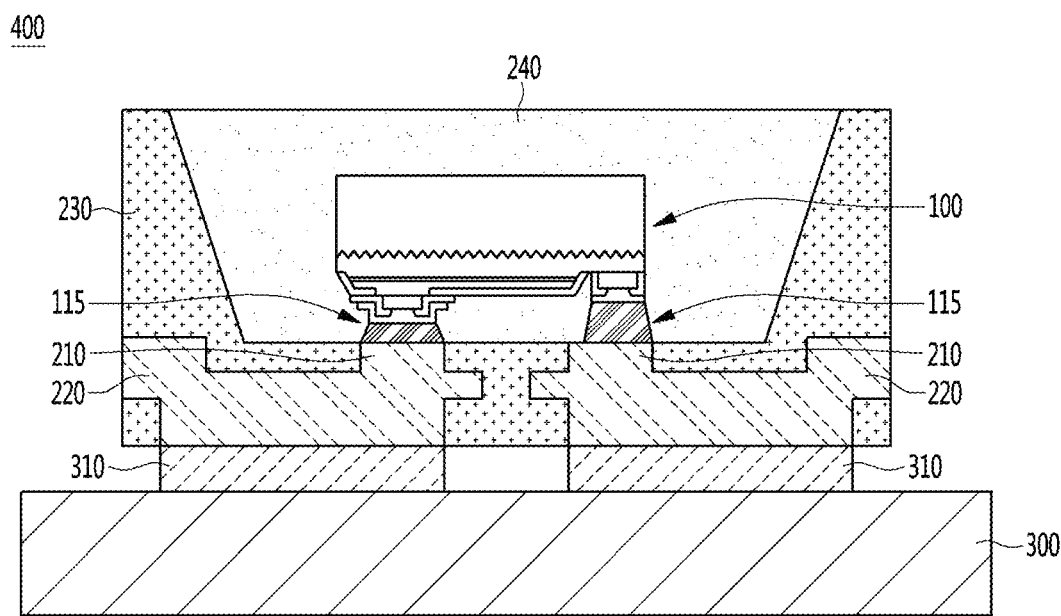

[FIG. 8]
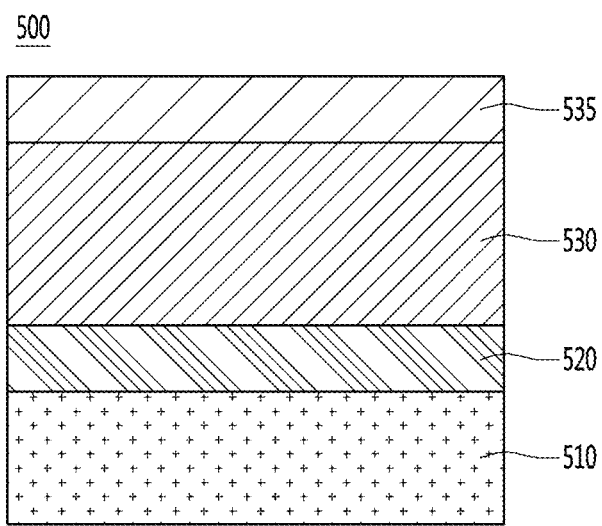

[FIG. 9]
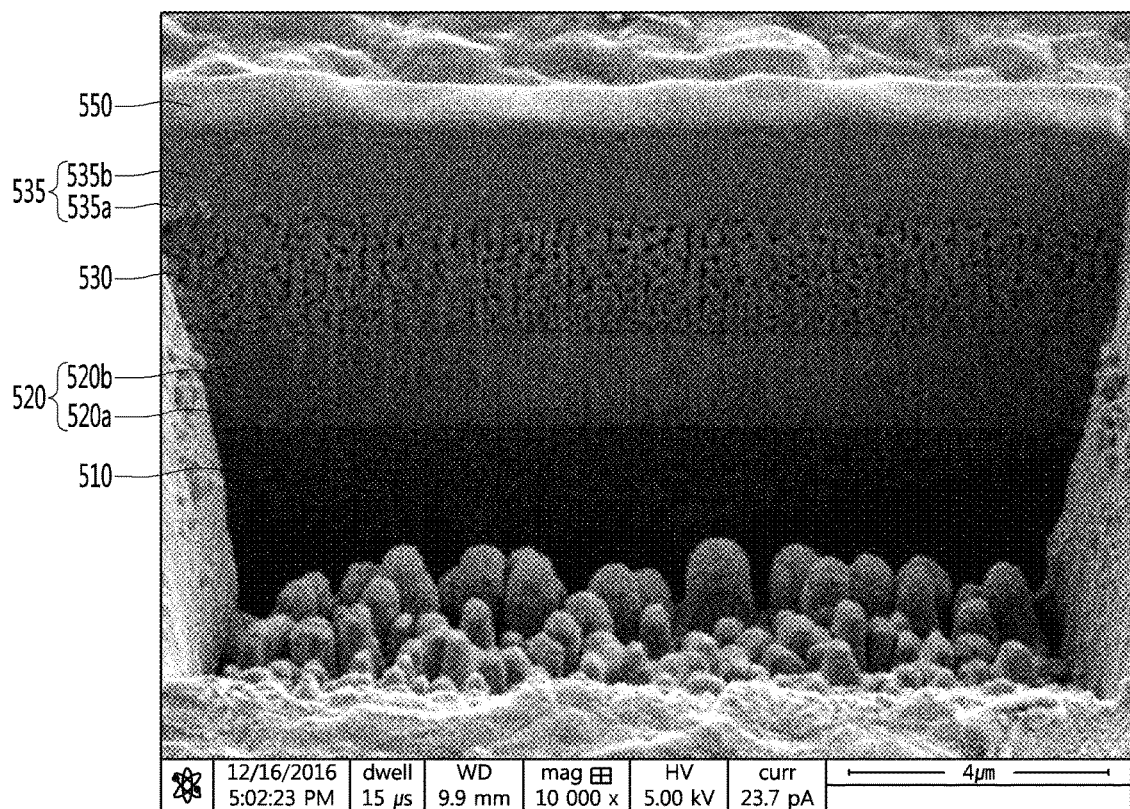

[FIG. 10]
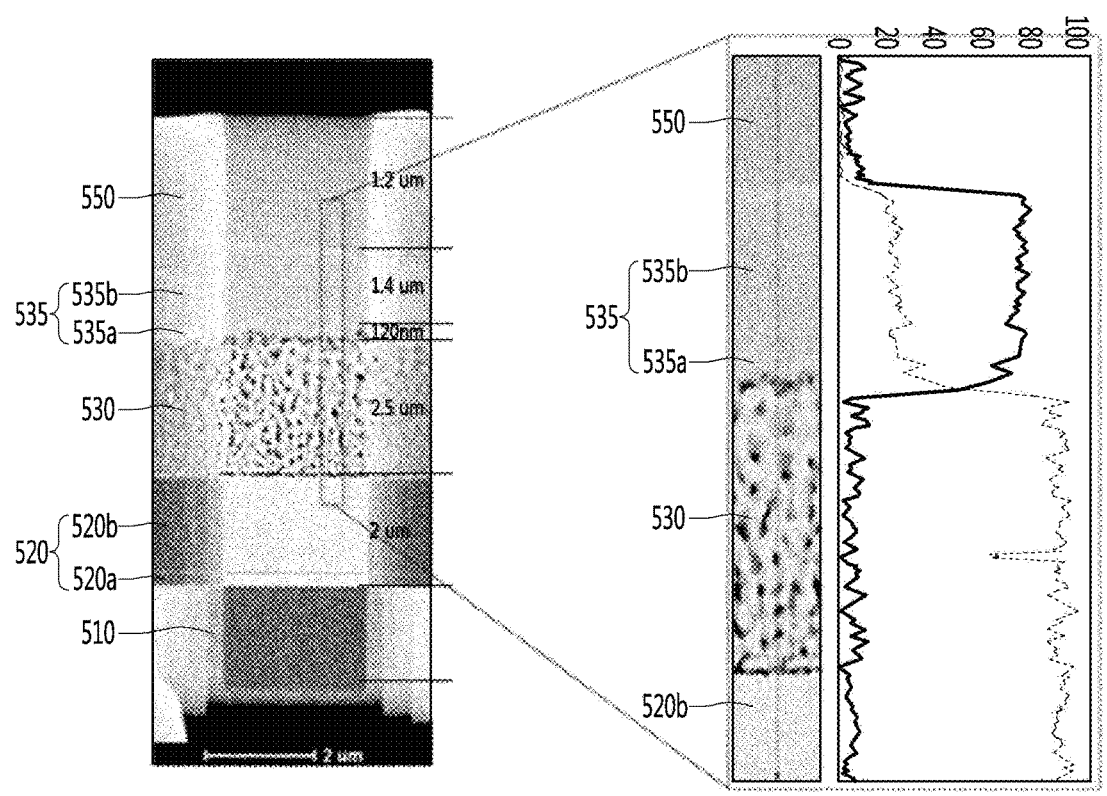

[FIG. 11]
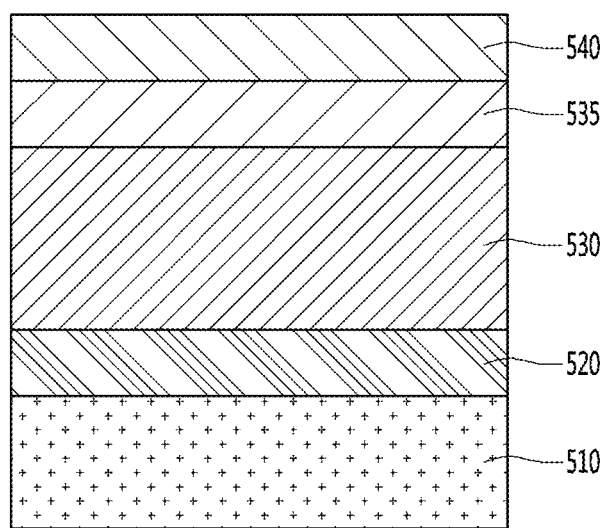

[FIG. 12]
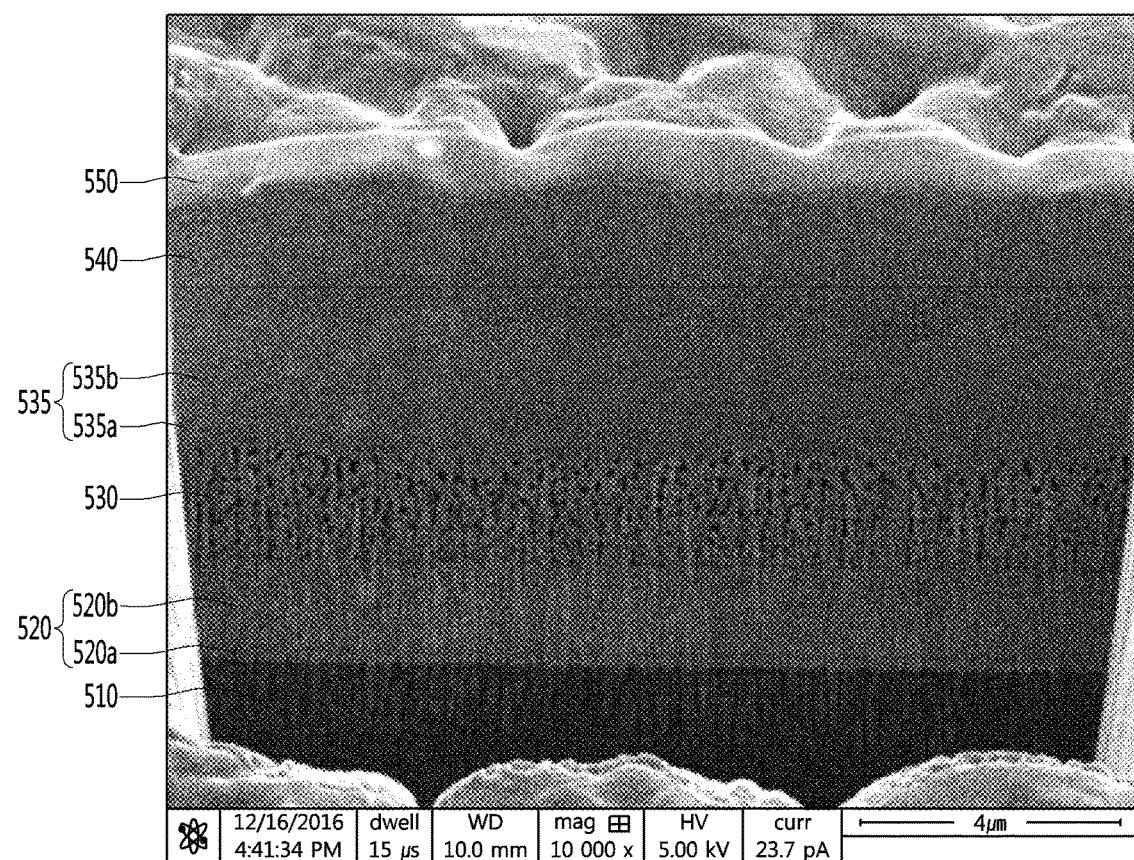

[FIG. 13]
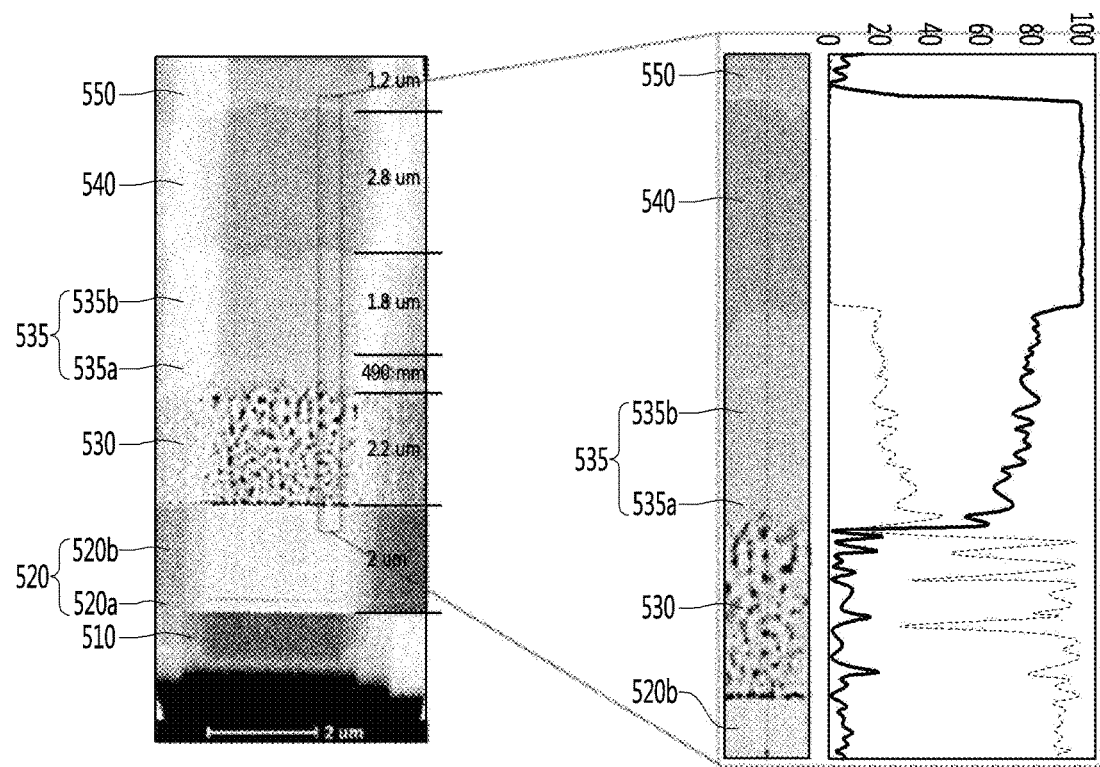

[FIG. 14]
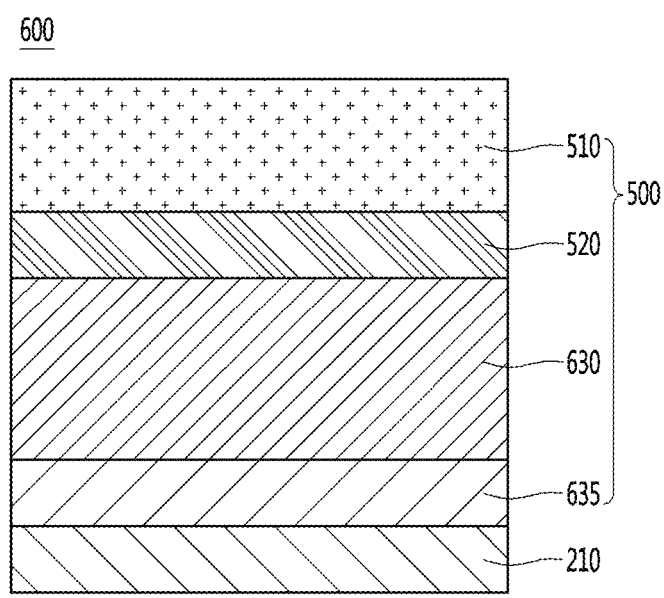

[FIG. 15]
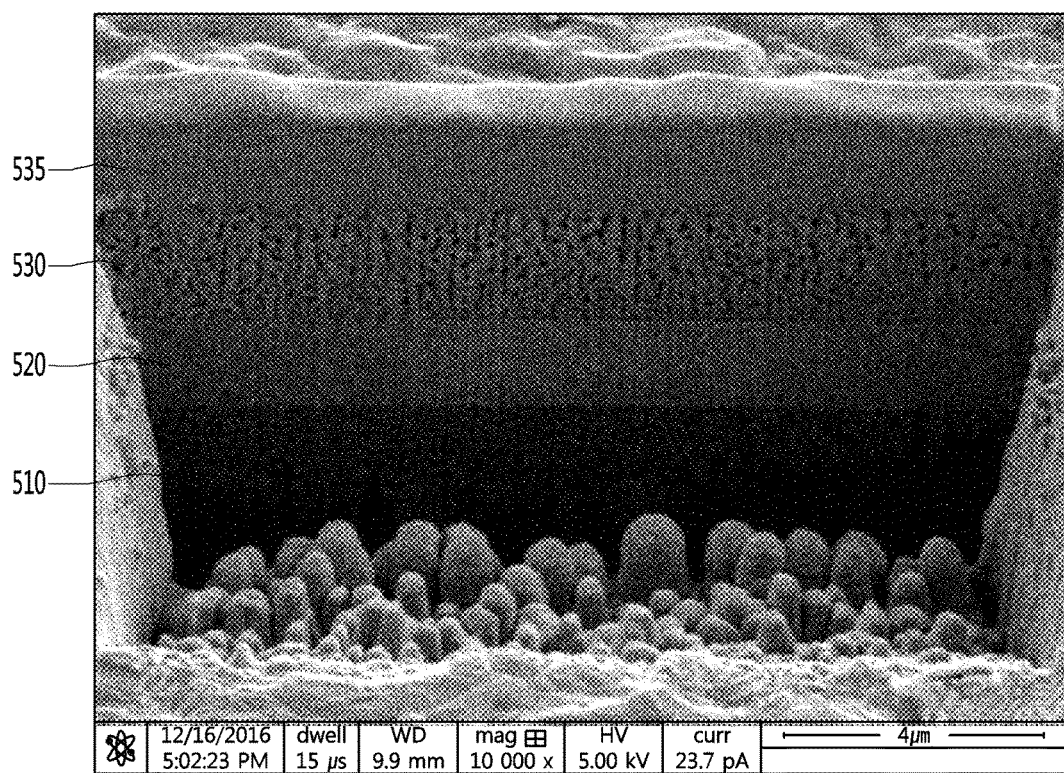

[FIG. 16]
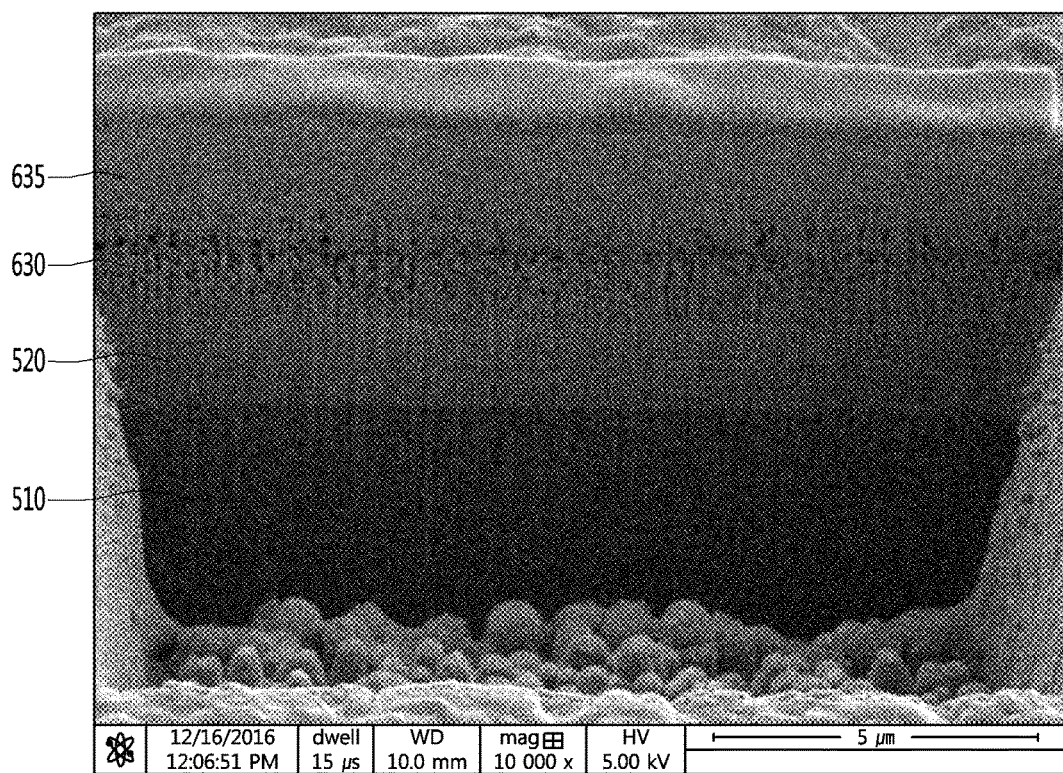

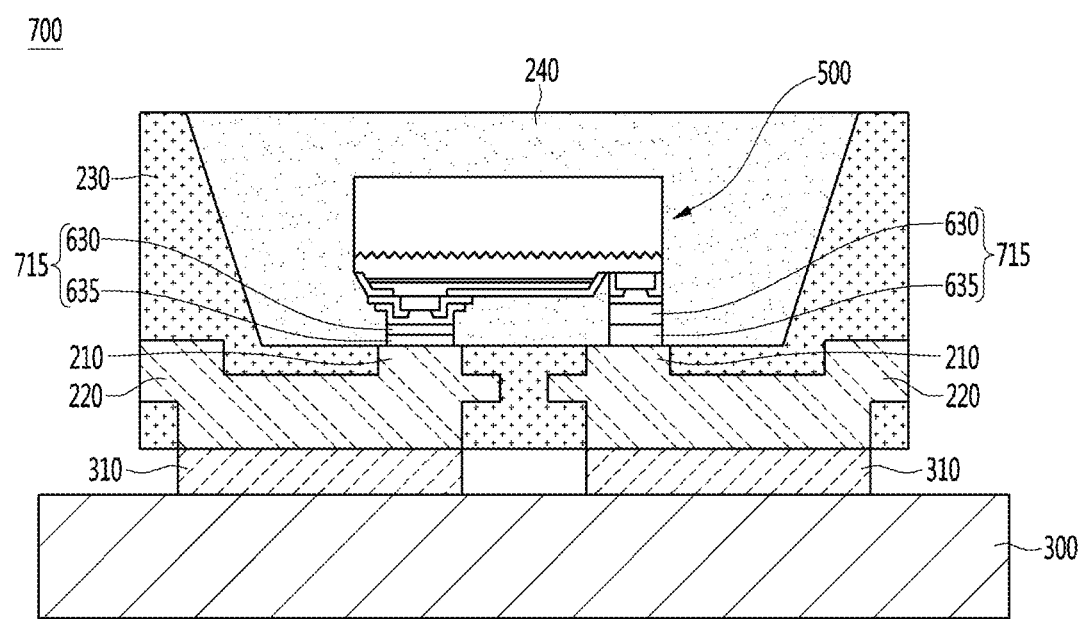
[FIG. 17]

[FIG. 18]
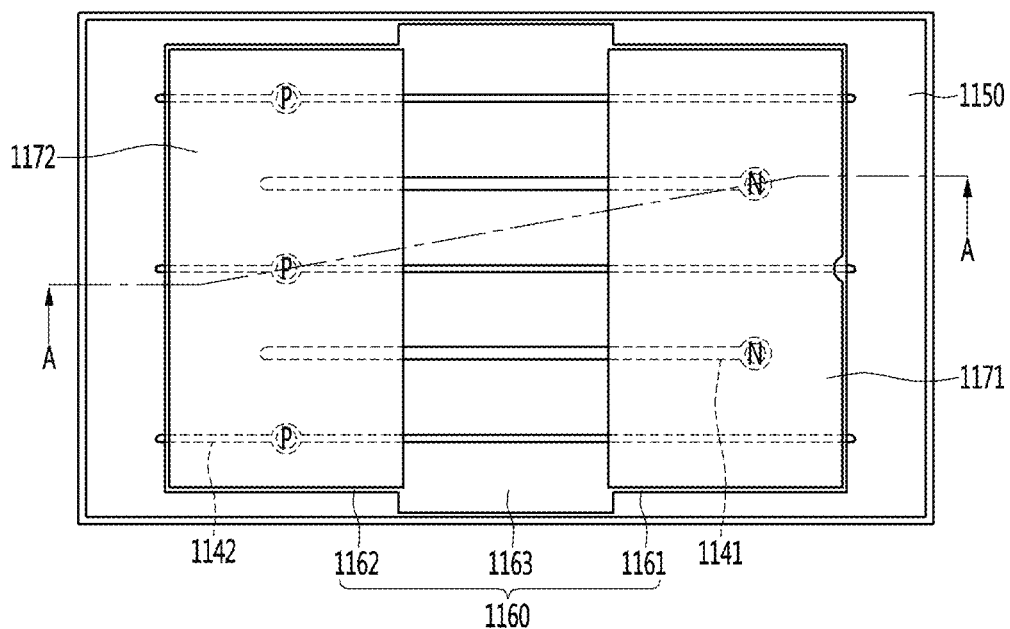

[FIG. 19]
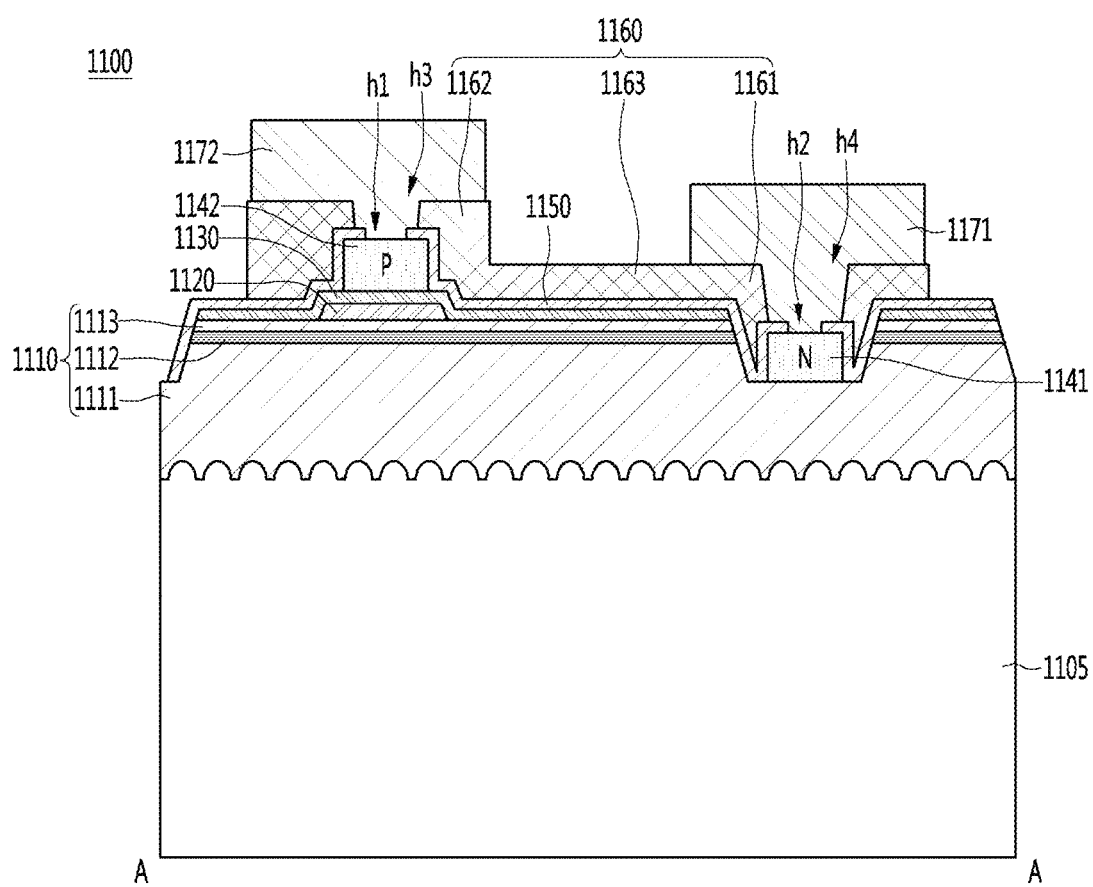

[FIG. 20]
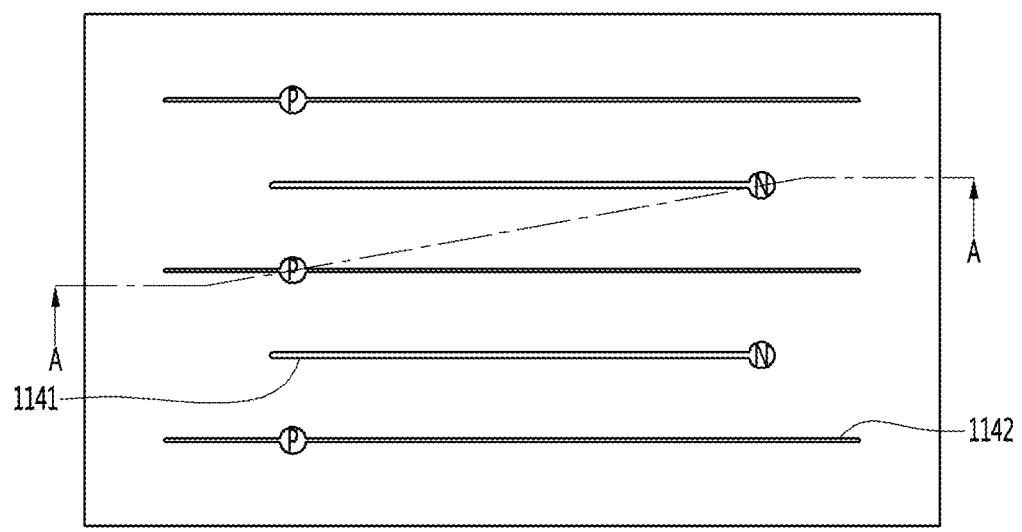

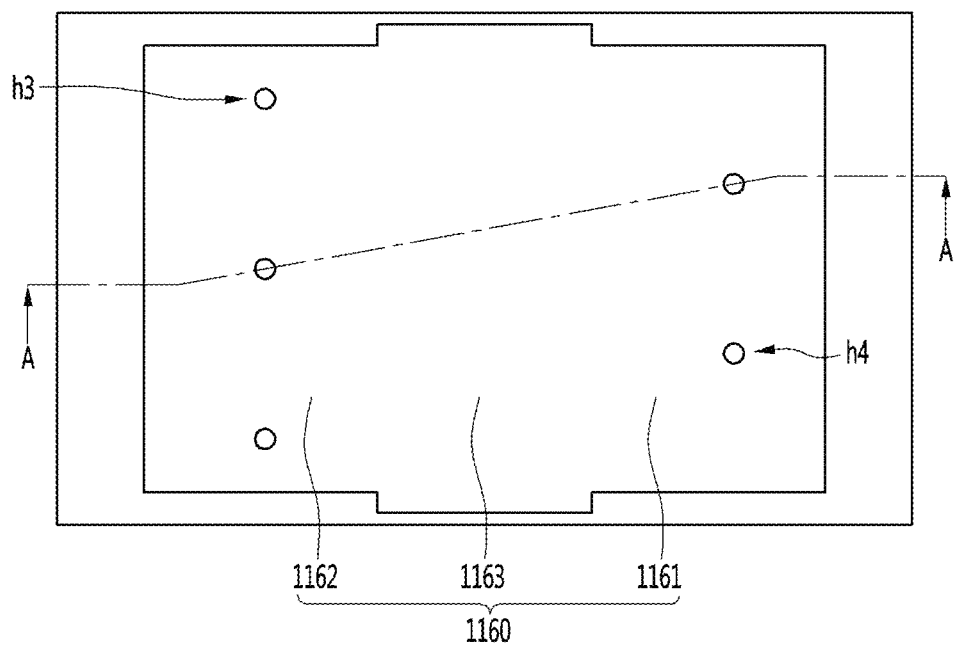
[FIG. 21]

[FIG. 22]
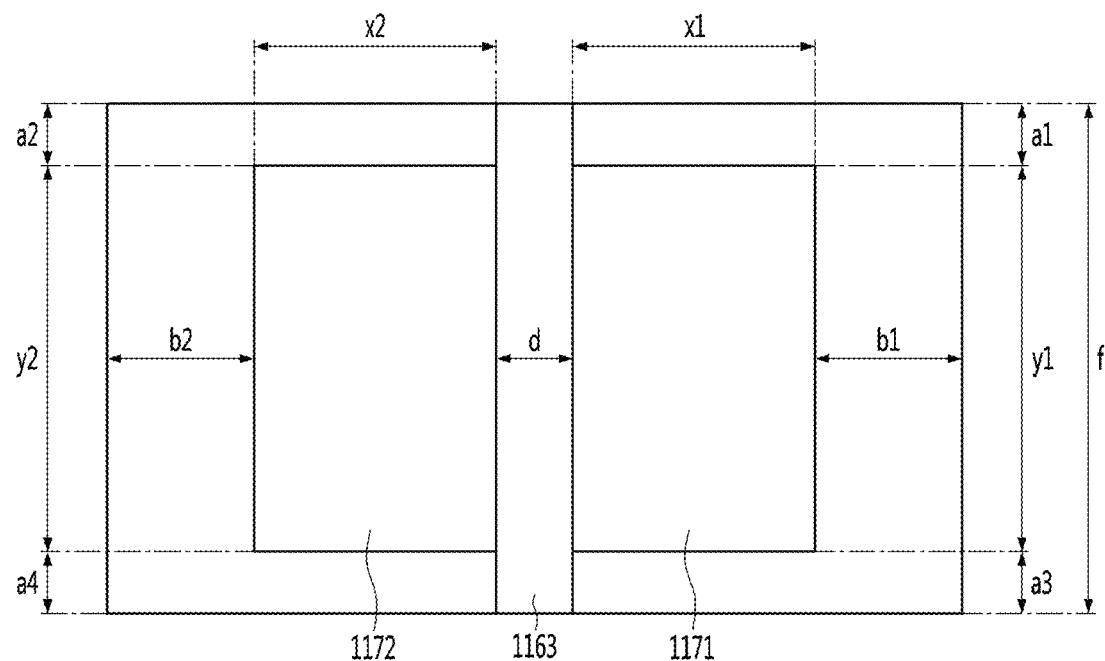

SEMICONDUCTOR DEVICE AND SEMICONDUCTOR DEVICE PACKAGE

CROSS REFERENCE TO RELATED APPLICATIONS

This application is the National Phase of PCT International Application No. PCT/KR2017/015516, filed on Dec. 27, 2017, which claims priority under 35 U.S.C. 119(a) to Patent Application Nos. 10-2017-0012804 and 10-2017-0036097 filed in the Republic of Korea on Jan. 26, 2017 and Mar. 22, 2017, respectively, all of which are hereby expressly incorporated by reference into the present application.

TECHNICAL FIELD

Embodiments relate to a semiconductor device, a method of manufacturing a semiconductor device, a semiconductor device package, and a method of manufacturing a semiconductor device package.

BACKGROUND ART

A semiconductor device comprising compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using a group III-V or a group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using a group III-V or a group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light source such as fluorescent lamps and incandescent lamps.

In addition, when a light receiving device such as a photo detector or a solar cell is manufactured using a group III-V or a group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness, and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light, and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

Meanwhile, semiconductor devices are required to have high output and high voltage driving as their application fields become diverse. The temperature is increased by the heat generated in the semiconductor device due to the high output and high voltage driving of the semiconductor device. However, when the heat dissipation from the semiconductor device is not enough, the light output may be lowered and the power conversion efficiency (PCE) may be lowered as the temperature rises. Accordingly, there is a demand for a method for efficiently dissipating heat generated in a semiconductor device and improving power conversion efficiency.

In addition, the semiconductor device may comprise an electrode capable of being supplied with power for driving from the outside. In addition, the semiconductor device may be electrically connected to a pad unit provided on an external submount, lead frame, or the like, for example, as a method of supplying power from the outside. At this time, the semiconductor device can be electrically connected to the pad unit by die bonding, flip chip bonding, wire bonding, or the like.

Meanwhile, a bonding pad may be used for electrical connection between the electrode of the semiconductor device and the pad unit. The bonding pad may be provided on at least one of the semiconductor device and the pad unit. At this time, there is a demand for a method of electrically connecting a semiconductor device and a pad unit by providing a small pressure at a low temperature and providing a stable bonding force.

DETAIL DESCRIPTION OF THE INVENTION

Technical Problem

An embodiment can provide a semiconductor device, a method of manufacturing a semiconductor device, a semiconductor device package, and a method of manufacturing a semiconductor device package, in which stable bonding can be performed with provision of a small pressure at a low temperature.

An embodiment can provide a semiconductor device, a method of manufacturing a semiconductor device, a semiconductor device package, and a method of manufacturing a semiconductor device package, that capable of preventing a re-melting phenomenon from occurring in a bonding region of a semiconductor device package in a process of re-bonding the semiconductor device package to a substrate or the like.

Technical Solution

A semiconductor device according to an embodiment may comprise: a light emitting structure comprising a first conductivity type semiconductor layer, a second conductivity type semiconductor layer, and an active layer disposed between the first conductivity type semiconductor layer and the second conductivity type semiconductor layer; a first bonding pad disposed on the light emitting structure and electrically connected to the first conductivity type semiconductor layer; a second bonding pad disposed on the light emitting structure and spaced apart from the first bonding pad, and electrically connected to the second conductivity type semiconductor layer; and a reflective layer disposed on the light emitting structure and disposed between the first bonding pad and the second bonding pad, wherein each of the first bonding pad and the second bonding pad comprises a porous metal layer comprising a plurality of pores and a bonding alloy layer disposed on the porous metal layer.

The semiconductor device according to the embodiment may comprise a bonding metal layer disposed on the bonding alloy layer.

The semiconductor device according to the embodiment may further comprise a metal layer disposed between the light emitting structure and the porous metal layer, and wherein the metal layer may comprise at least one layer of an adhesive metal layer, a reflective metal layer, and a barrier metal layer.

According to the embodiment, wherein the bonding alloy layer may comprise a plurality of alloy layers including a plurality of metal materials and having different material composition ratios.

According to the embodiment, wherein the bonding alloy layer may comprise an alloy layer including Au and Sn, and wherein, with reference to a Au atomic composition ratio in the alloy layer disposed in a first region that is closer to the porous metal layer, a Au atomic composition ratio in the alloy layer disposed in a second region that is relatively far from the porous metal layer with reference to the first region may be provided smaller.

According to the embodiment, wherein, in the alloy layer disposed in the first region, the Au atomic composition ratio may be 25 at % or more and 50 at % or less, and a Sn atomic composition ratio may be 50 at % or more and 75 at % or less, and wherein, in the alloy layer disposed in the second region, the Au atomic composition ratio may be 5 at % or more and 25 at % or less, and a Sn atomic composition ratio may be provided of 75 at % or more and 95 at % or less.

According to the embodiment, wherein the porous metal layer may be provided of a Au atomic composition ratio of 90 at % or more and 95 at % or less, and a Sn atomic composition ratio of 5 at % or more and 10 at % or less.

According to the embodiment, wherein a thickness of the porous metal layer may be in a range of 500 nanometers to 10 micrometers, and wherein a thickness of the bonding alloy layer may be provided in a range of 100 nanometers to 10 micrometers.

According to the embodiment, wherein the bonding alloy layer may comprise a AuSn alloy layer, and a composition ratio of Au:Sn based on at % in the AuSn alloy layer may be provided of 9:1 or more and 2.5:7.5 or less.

The semiconductor device according to the embodiment may comprise a Au layer disposed on the bonding alloy layer.

According to the embodiment, wherein the porous metal layer may comprise at least one selected from a group including Au, Ag, and Cu, or an alloy thereof.

According to the embodiment, wherein the bonding metal layer may comprise Sn or In.

According to the embodiment, wherein a sum of an area of the first bonding pad and an area of the second bonding pad, when viewed from a top of the semiconductor device, may be equal to or smaller than 60% of a total area of an upper surface of the semiconductor device on which the first bonding pad and the second bonding pad are disposed, wherein an area of the reflective layer may be provided not less than 10% and not more than 25% of the total area of the upper surface of the semiconductor device, wherein light generated in the light emitting structure is not transmitted and emitted through a first region provided between the first bonding pad and the second bonding pad, and wherein the light generated in the light emitting structure is transmitted and emitted through a second region and a third region, the second region provided between side surfaces of the semiconductor device in a major axis direction and the first bonding pad or the second bonding pad which are adjacent to the side surfaces, and the third region provided between side surfaces of the semiconductor device in a minor axis direction and the first bonding pad or the second bonding pad which are adjacent to the side surfaces.

According to embodiment, wherein a sum of an area of the first bonding pad and an area of the second bonding pad may be provided greater than or equal to 30% of a total area of the semiconductor device, when viewed from a top of the semiconductor device.

According to the embodiment, wherein the first bonding pad or the second bonding pad is provided along a major axis direction of the semiconductor device at a length of x and is provided along a minor axis direction of the semiconductor device at a length of y, and wherein a ratio of x and y is provided in a range of 1:1.5 to 1:2.

According to the embodiment, wherein a distance between the first bonding pad and the second bonding pad may be equal to or greater than 125 micrometers and equal to or less than 300 micrometers.

A semiconductor device package according to an embodiment may comprise a package body providing a recess and comprising a pad unit provided on a bottom surface of the recess; a bonding alloy layer disposed in the recess and disposed on the pad unit; a porous metal layer disposed on the bonding alloy layer and comprising a plurality of pores; a metal layer disposed on the porous metal layer; and a semiconductor layer disposed on the metal layer.

The semiconductor device package according to the embodiment may comprise a bonding metal layer disposed between the bonding alloy layer and the pad unit.

According to the embodiment, wherein the bonding alloy layer may comprise a plurality of alloy layers including a plurality of metal materials and having different material composition ratios.

According to the embodiment, wherein the bonding alloy layer may comprise an alloy layer including Au and Sn, and wherein, with reference to a Au atomic composition ratio in the alloy layer disposed in a first region that is closer to the porous metal layer, a Au atomic composition ratio in the alloy layer disposed in a second region that is far from the porous metal layer may be provided smaller.

According to the embodiment, wherein, in the alloy layer disposed in the first region, the Au atomic composition ratio may be 25 at % or more and 50 at % or less, and a Sn atomic composition ratio may be 50 at % or more and 75 at % or less, and wherein, in the alloy layer disposed in the second region, the Au atomic composition ratio may be 5 at % or more and 25 at % or less, and a Sn atomic composition ratio may be provided of 75 at % or more and 95 at % or less.

According to the embodiment, wherein the porous metal layer may be provided of a Au atomic composition ratio of 90 at % or more and 95 at % or less, and a Sn atomic composition ratio of 5 at % or more and 10 at % or less.

According to the embodiment, wherein a thickness of the porous metal layer may be in a range of 500 nanometers to 10 micrometers, and wherein a thickness of the bonding alloy layer may be provided in a range of 100 nanometers to 10 micrometers.

According to the embodiment, wherein the bonding alloy layer may comprise a AuSn alloy layer, and a composition ratio of Au:Sn based on at % in the AuSn alloy layer may be provided of 9:1 or more and 2.5:7.5 or less.

According to the embodiment, wherein the bonding metal layer may comprise Sn or In.

A method of manufacturing a semiconductor device according to an embodiment may comprise: forming a metal layer on a semiconductor layer; forming an alloy layer in which a first metal and a second metal are bonded on the metal layer; removing the second metal through a chemical treatment on the alloy layer and forming a porous metal layer of a first metal including a plurality of pores; and forming a bonding metal layer on the porous metal layer.

A method of manufacturing a semiconductor device package according to an embodiment may comprise: providing a package body including a pad unit; providing a semiconductor device directly on the pad unit; providing at least one of heat or pressure to bond the semiconductor device to the pad unit; wherein the semiconductor device may comprises: a semiconductor layer; a metal layer disposed on the semiconductor layer; a porous metal layer disposed on the metal layer and including a plurality of pores; and a bonding alloy layer disposed on the porous metal layer.

Advantageous Effects

According to the semiconductor device, the method of manufacturing the semiconductor device, the semiconductor device package, and the method of manufacturing the semiconductor device package of the embodiments, there is an advantage that stable bonding can be performed by providing a small pressure at a low temperature.

According to the semiconductor device, the method of manufacturing the semiconductor device, the semiconductor device package, and the method of manufacturing the semiconductor device package of the embodiments, there is an advantage that it is capable of preventing a re-melting phenomenon from occurring in a bonding region of a semiconductor device package in a process of re-bonding the semiconductor device package to a substrate or the like.

DESCRIPTION OF DRAWINGS

FIG. 1 is a view showing a semiconductor device according to an embodiment of the present invention.

FIGS. 2 and 3 are views explaining a process of forming a porous metal layer applied to a semiconductor device according to an embodiment of the present invention.

FIG. 4 is a photograph showing a cross section of the porous metal layer shown in FIG. 3.

FIG. 5 is a photograph showing a surface of the porous metal layer shown in FIG. 3.

FIG. 6 is a view showing a semiconductor device package according to an embodiment of the present invention.

FIG. 7 is a view showing another example of a semiconductor device package according to an embodiment of the present invention.

FIG. 8 is a view showing another example of a semiconductor device according to an embodiment of the present invention.

FIG. 9 is an example of a SEM analysis photograph of a semiconductor device according to an embodiment of the present invention.

FIG. 10 is an example of a TEM analysis photograph of a semiconductor device according to an embodiment of the present invention.

FIG. 11 is a view showing still another example of a semiconductor device according to an embodiment of the present invention.

FIG. 12 is another example of a SEM photograph of a semiconductor device according to an embodiment of the present invention.

FIG. 13 is another example of a TEM analysis photograph of a semiconductor device according to an embodiment of the present invention.

FIG. 14 is a view showing another example of a semiconductor device package according to an embodiment of the present invention.

FIG. 15 is an example of a SEM analysis photograph showing a state before a semiconductor device is bonded to a pad unit in a semiconductor device package according to an embodiment of the present invention.

FIG. 16 is an example of a SEM analysis photograph showing a state after a semiconductor device is bonded to a pad unit in a semiconductor device package according to an embodiment of the present invention.

FIG. 17 is a view showing still another example of a semiconductor device package according to an embodiment of the present invention.

FIG. 18 is a plan view showing still another example of a semiconductor device according to an embodiment of the present invention.

FIG. 19 is a sectional view taken along line A-A of the semiconductor device shown in FIG. 18.

FIG. 20 is a view showing an example of the arrangement of a first electrode and a second electrode applied to a semiconductor device according to an embodiment of the present invention.

FIG. 21 is a view showing an example of the arrangement of a reflective layer applied to a semiconductor device according to an embodiment of the present invention.

FIG. 22 is a view showing an example of the arrangement of a first bonding pad and a second bonding pad applied to a semiconductor device according to an embodiment of the present invention.

MODE FOR INVENTION

Hereinafter, embodiments will be described with reference to the accompanying drawings. In the description of the embodiments, in the case that each layer (film), region, pattern or structure may be referred to as provided "on/over" or "under" a substrate, each layer (film), region, pad, or pattern, the terms "on/over" and "under" include both "directly" and "indirectly interposed with another layer". In addition, "on/over" or "under" of each layer will be described based on the drawings.

Hereinafter, a semiconductor device, a method of manufacturing a semiconductor device, a semiconductor device package, and a method of manufacturing a semiconductor device package according to embodiments of the present invention will be described in detail with reference to the accompanying drawings.

The semiconductor device according to the embodiment of the present invention may be applied to a light emitting device including a light emitting diode device and a laser diode device. Further, the semiconductor device according to the embodiment of the present invention may be applied to a light receiving device. Further, the semiconductor device according to the embodiment of the present invention may be applied to a power device.

First, a semiconductor device according to an embodiment will be described with reference to FIG. 1. FIG. 1 is a view showing a semiconductor device according to an embodiment of the present invention.

The semiconductor device 100 according to the embodiment may comprise a semiconductor layer 110, as shown in FIG. 1. The semiconductor device 100 shown in FIG. 1 shows only a partial region in which power is supplied to the semiconductor layer 110 from the outside.

The semiconductor layer 110 may be provided of a compound semiconductor. For example, the semiconductor layer 110 may be provided of a Group II-VI compound semiconductor or a Group III-V compound semiconductor. For example, the semiconductor layer 110 may comprise at least two elements selected from aluminum (Al), gallium (Ga), indium (In), phosphorus (P), arsenic (As), and nitrogen (Ni).

According to the embodiment, the semiconductor layer 110 may be provided of a semiconductor material having a composition formula of $In_xAl_yGa_{1-x-y}N$ (0≤x≤1, 0≤y≤1, 0≤x+y≤1). The semiconductor layer 110 may be selected from, for example, InAlGaN, InAlN, InGaN, AlGaN, GaN, and the like.

In addition, according the embodiment, the semiconductor layer 110 may be provided of a semiconductor material having a composition formula of $(Al_xGa_{1-x})_yIn_{1-y}P$ (0≤x≤1, 0≤y≤1). The semiconductor layer 110 may be selected from, for example, AlGaInP, AlInP, GaP, GaInP, and the like.

In addition, according to the embodiment, the semiconductor layer 110 may comprise an n-type dopant. For example, the semiconductor layer 110 may comprise at least one dopant selected from a group including Si, Ge, Sn, Se, Te, and the like. In addition, the semiconductor layer 110 may comprise a p-type dopant. For example, the semiconductor layer 110 may comprise at least one dopant selected from a group including Mg, Zn, Ca, Sr, Ba, and the like.

The semiconductor device 100 according to the embodiment may comprise a metal layer 120, a porous metal layer 130, and a bonding metal layer 140, as shown in FIG. 1. For example, the metal layer 120, the porous metal layer 130, and the bonding metal layer 140 may be collectively referred to as a bonding pad layer.

Meanwhile, according to the semiconductor device 100 of the embodiment, an additional conductive material that is electrically connected to the semiconductor layer 110 may be further provided between the metal layer 120 and the semiconductor layer 110. Also, according to the semiconductor device 100 of another embodiment, the metal layer 120 may not be provided, and the porous metal layer 130 may be disposed in direct contact with the semiconductor layer 110.

According to the embodiment, the metal layer 120 may be disposed on the semiconductor layer 110, as shown in FIG. 1. The porous metal layer 130 may be disposed on the metal layer 120. The porous metal layer 130 may comprise a plurality of pores. The bonding metal layer 140 may be disposed on the porous metal layer 130.

The porous metal layer 130 according to the embodiment may comprise the same material as the metal layer 120, for example. The metal layer 120 may comprise a material having excellent adhesion to the semiconductor layer 110. In addition, the metal layer 120 may comprise a material having excellent reflection characteristics. The metal layer 120 may comprise at least one selected from a group including, for example, Au, Ag, and Cu.

The porous metal layer 130 may be referred to as a metal sponge layer, which is a metal layer comprising a plurality of pores. As an example, the porous metal layer 130 may be provided in a thickness of a few micrometers. The method of forming the porous metal layer 120 will be described later.

The semiconductor device 100 according to the embodiment may be attached to a submount or attached to a lead frame or the like, and supplied in the form of a semiconductor device package. At this time, the bonding metal layer 140 may be electrically connected to a pad unit provided on the submount or a pad unit provided on the lead frame. For example, the bonding metal layer 140 may be disposed in direct contact with the pad unit provided on the submount or the pad unit provided on the lead frame.

According to the embodiment, the bonding metal layer 140 may comprise a bonding material for connection with the pad unit. For example, the bonding metal layer 140 may comprise tin (Sn) for electrical connection with the pad unit.

Next, a method of forming the porous metal layer 130 according to the embodiment will be described with reference to FIGS. 2 and 3. FIGS. 2 and 3 are views explaining a process of forming a porous metal layer applied to the semiconductor device according to the embodiment of the present invention.

According to the embodiment, as shown in FIG. 2, an alloy layer in which a first metal 131 and a second metal 133 are combined may be formed on a substrate 105. For example, the first metal 131 and the second metal 133 may be formed on the substrate 105 by an electron beam evaporator or the like. The first metal 131 and the second metal 133 may be selected from materials that satisfy the physical properties that can be combined with each other to form an alloy layer.

As an example, the first metal 131 may be selected from a group including Au, Ag, and Cu. In addition, the second metal 133 may be selected from a bonding material including Sn and In, as an example.

Thereafter, a chemical treatment may be performed on the alloy layer to remove the second metal 133 from the alloy layer. As the second metal 133 is removed from the alloy layer, a porous metal layer 130 including a plurality of pores p may be formed. For example, a plurality of pores p may be formed in a region where the second metal 133 is removed from the alloy layer in which the first metal 131 and the second metal 133 are combined. The plurality of pores p provided in the porous metal layer 130 may be provided of a nano-size, for example.

According to the embodiment, the porous metal layer 130 may be formed of a metal layer having a plurality of pores, as shown in FIGS. 4 and 5. FIG. 4 is a photograph showing a cross section of the porous metal layer shown in FIG. 3, and FIG. 5 is a photograph showing a surface of the porous metal layer shown in FIG. 3.

As shown in FIGS. 4 and 5, according to the porous metal layer 130 of the embodiment, it can be seen that a plurality of pores are formed on the surface, and that a plurality of pores are formed also in the depth direction. The porous metal layer 130 according to the embodiment may be referred to as a kind of metal sponge layer including a plurality of pores. As an example, the porous metal layer 130 may be referred to as a metal sponge layer having a plurality of nano-scale pores.

The chemical treatment for the alloy layer may be carried out using an etchant as an example. The second metal 133 may be removed from the alloy layer by selection of an appropriate etchant to form the porous metal layer 130 provided with a plurality of pores p.

As an example, the etchant may comprise a solution of strong acid or a solution of strong alkaline. The etchant may be selected from at least one of strong acid solutions including nitric acid (HNO3). Also, the etchant may be selected from at least one of strong alkaline solutions including sodium hydroxide (NaOH).

According to the embodiment, the porous metal layer 130, which may be applied to the semiconductor device 100, may be formed in a manner similar to that described with reference to FIGS. 2 and 3.

According to the method of manufacturing the semiconductor device of the embodiment, the metal layer 120 may be formed on the semiconductor layer 110.

In addition, an alloy layer in which the first metal and the second metal are combined may be formed on the metal layer 120. Next, as described with reference to FIGS. 2 and 3, the second metal may be removed through chemical treatment of the alloy layer to form a porous metal layer 130 of a first metal having a plurality of pores.

Next, the bonding metal layer 140 may be formed on the porous metal layer 130.

According to the method of manufacturing the semiconductor device of the embodiment, a bonding pad layer capable of supplying electricity to the semiconductor layer 110 can be formed through this process.

Meanwhile, the semiconductor device 100 according to the embodiment can be attached to a submount or attached to a lead frame or the like, and supplied in the form of a semiconductor device package. At this time, the bonding metal layer 140 may be electrically connected to a pad unit provided on the submount or a pad unit provided on the lead frame. For example, the bonding metal layer 140 may be disposed in direct contact with the pad unit provided on the submount or the pad unit provided on the lead frame.

As an example, the bonding metal layer 140 may be connected to the pad unit by die bonding method. In addition, the bonding metal layer 140 may be connected to the pad unit by flip-chip bonding method.

Next, referring to FIG. 6, a semiconductor device package according to an embodiment will be described. FIG. 6 is a view showing a semiconductor device package according to an embodiment of the present invention. In describing the semiconductor device package according to the embodiment with reference to FIG. 6, description overlapping with those described with reference to FIGS. 1 to 5 may be omitted.

The semiconductor device package 200 according to the embodiment may comprise a pad unit 210, as shown in FIG. 6. The semiconductor device package 200 shown in FIG. 6 shows only a partial region around the pad unit 210 that supplies power to a semiconductor device.

As an example, the pad unit 210 may be provided on the submount. Also, the pad unit 210 may be provided on the lead frame. Also, the pad unit 210 may be provided on a circuit board.

According to the method of manufacturing the semiconductor device package of the embodiment, the semiconductor device 100 described with reference to FIGS. 1 to 5 may be provided on the pad unit 210. At this time, the bonding metal layer 140 of the semiconductor device 100 may be provided to be in contact with and on the pad unit 210.

As an example, the bonding metal layer 140 may be disposed in direct contact with the pad unit 210. According to another embodiment, in addition to the bonding metal layer 140, a bonding material may be further provided between the pad unit 210 and the bonding metal layer 140.

According to the method of manufacturing the semiconductor device package of the embodiment, at least one of heat or pressure may be provided in a state where the bonding metal layer 140 is disposed on the pad unit 210.

As an example, heat may be supplied in a state where the bonding metal layer 140 and the pad unit 210 are in contact with each other. In addition, pressure may be supplied in a state where the bonding metal layer 140 and the pad unit 210 are in contact with each other. In addition, heat and pressure may be supplied in a state where the bonding metal layer 140 and the pad unit 210 are in contact with each other.

According to the embodiment, a bonding material contained in the bonding metal layer 140 may be diffused into the porous metal layer 130 as heat or pressure is applied between the bonding metal layer 140 and the pad unit 210. In addition, an alloy layer 135 may be formed by combining between a bonding material diffused from the bonding metal layer 140 and a material contained in the porous metal layer 130 in a plurality of pore regions provided in the porous metal layer 130. The alloy layer 135 may be formed between the bonding metal layer 140 and the porous metal layer 130.

Thus, according to the method of manufacturing the semiconductor device package of the embodiment, the bonding process can be performed at a lower temperature and a lower pressure as compared with commonly known bonding methods including eutectic bonding. In addition, a metal compound may be generated by chemical bonding at the interface between the porous metal layer 130 and the bonding material diffused from the bonding metal layer 140.

According to the embodiment, the metal compound formed at the interface between the porous metal layer 130 and the bonding material diffused from the bonding metal layer 140 may have a relatively higher melting point than the melting point of the material before bonding. For example, the melting point of the alloy layer 135 formed by the bonding between the porous metal layer 130 and the bonding material diffused from the bonding metal layer 140 may be higher than the melting point of the bonding metal layer 140.

The semiconductor device package 200 according to the embodiment may comprise a pad unit 210 and a bonding metal layer 140, as shown in FIG. 6. The bonding metal layer 140 may be disposed on the pad unit 210.

In addition, the semiconductor device package 200 according to the embodiment may further comprise an alloy layer 135, a porous metal layer 130, a metal layer 120, and a semiconductor layer 110.

The alloy layer 135 may be disposed on the bonding metal layer 130. The porous metal layer 130 may be disposed on the alloy layer 135. The porous metal layer 130 may comprise a plurality of pores.

The alloy layer 135 may be formed by a combining of a material included in the bonding metal layer 140 and a material included in the porous metal layer 130, as described above. For example, when the porous metal layer 130 comprises Au and the bonding metal layer 140 comprises Sn, the alloy layer 135 may comprise AuSn.

According to the embodiment, the melting point of the alloy layer 135 may be provided higher than the melting point of the bonding metal layer 140.

As an example, the melting point of the bonding metal layer 140 may be in a range of 220 degrees to 250 degrees. In addition, the alloy layer 135 may have a higher melting point than 250 degrees. The melting point of the alloy layer 135 can be flexibly selected by adjusting the composition ratio of the material of the alloy layer 135.

The metal layer 120 may be disposed on the porous metal layer 130. The semiconductor layer 110 may be disposed on the metal layer 120.

Therefore, according to the embodiment, power supplied through the pad unit 210 can be applied to the semiconductor layer 110.

The semiconductor device package 200 of the embodiment may be, according to the application product, additionally surface mounted (SMT) and attached to a main board supplying power. At this time, as an example, the semiconductor device package 200 may be surface mounted (SMT) on the main board by soldering or the like.

Meanwhile, according to the conventional method for manufacturing a semiconductor device package, a semiconductor device is bonded to a pad unit through a bonding process. In the case where the bonding is performed through the first bonding process in the process of manufacturing the semiconductor device package, in the reflow process for the second bonding process in which the surface mounting is further performed on the main board, so that the bonding material used in the first bonding process can be melted again. Accordingly, in the reflow process for the second bonding process, the stability of the electrical connection and the physical connection between the semiconductor device package and the pad unit can be weakened.

However, according to the method of manufacturing the semiconductor device package according to the embodiment, the melting point of the alloy layer 135, which provides the bonding force between the semiconductor device according to the embodiment and the pad unit, can be formed higher than the melting point of the general bonding material. Therefore, even when the semiconductor device package 200 according to the embodiment is bonded to the main board through a reflow process, re-melting phenomenon does not occur, so there are advantages that electrical connection and physical bonding force are not deteriorated.

Meanwhile, according to the application example of the semiconductor device package 200 of the embodiment, the pad unit 210 may be disposed on the resin, or the pad unit 210 may be disposed around the resin. Accordingly, when the pad unit 210 and the semiconductor device 100 are bonded at a high temperature, deformation of the resin may occur or discoloration may occur in the resin.

However, according to the semiconductor device package 200 of the embodiment, as described above, the semiconductor device 100 can be bonded to the pad unit 210 in a low-temperature environment. Thus, according to the embodiment, the resin disposed around the pad unit can be prevented from being exposed to high temperature, so that the resin can be prevented from being damaged or discolored.

Meanwhile, in the semiconductor device package 200 of the embodiment described with reference to FIG. 6, the bonding metal layer 140 is disposed on the pad unit 210, and the alloy layer 135 is disposed on the bonding metal layer 140.

However, according to another embodiment, a thickness of the bonding metal layer 140 may be adjusted so that the material consisting the bonding metal layer 140 may be diffused all into the porous metal layer 130 during bonding of the semiconductor device 100 and the pad unit 210. Accordingly, the alloy layer 135 may be disposed in direct contact with and on the pad unit 210.

According to the method of manufacturing the semiconductor device package of the embodiment, the bonding material contained in the bonding metal layer 140 may provide a bonding force with the pad unit 130. In addition, an intermetallic compound may be formed while a bonding material contained in the bonding metal layer 140 is diffused into a plurality of pores provided in the porous metal layer 130. Accordingly, according to the embodiment, a stable bonding force can be provided between the pad unit 210 and the alloy layer 135.

According to the embodiment, bonding can be performed by diffusion of a bonding material, and an alloy having a high melting point can be formed after bonding. For example, the bonding can be performed by diffusion of Sn material, and an alloy of AuSn having a relatively high melting point can be formed.

Meanwhile, FIG. 7 is a view showing another example of a semiconductor device package according to an embodiment of the present invention. Referring to FIG. 7, in explaining the semiconductor device package according to the embodiment, description overlapping with those described with reference to FIGS. 1 to 6 may be omitted.

As shown in FIG. 7, the semiconductor device package 400 according to the embodiment may comprise a semiconductor device 100, a pad unit 210, a lead frame 220, a package body 230, and a main board 300. The semiconductor device 100 may be electrically connected to the pad unit 210 provided on the package body 230. The pad unit 210 may be electrically connected to the main board 300 that is disposed in a lower portion. For example, the pad unit 210 may be electrically connected to the main board 300 through the lead frame 220 disposed at a lower portion.

The semiconductor device 100 may be disposed on the pad unit 210 provided on the lead frame 220. The semiconductor device 100 may be disposed in a recess provided by the package body 230. A molding unit 240 may be disposed on the semiconductor device 100. For example, the molding unit 240 may comprise wavelength conversion particles that receive light provided from the semiconductor device 100 and emit wavelength converted light.

As shown in FIG. 7, the semiconductor device package 400 according to the embodiment may comprise a first bonding layer 115 disposed on the pad unit 210 and a second bonding layer 310 disposed under the lead frame 220.

As an example, the first bonding layer 115 may comprise a bonding metal layer 140, an alloy layer 135, and a porous metal layer 130 as described with reference to FIG. 6. In addition, the second bonding layer 310 may comprise a bonding material used in a soldering process.

According to the embodiment, as described with reference to FIGS. 1 to 6, the first bonding layer 115 may have a higher melting point than the second bonding layer 310. In addition, the first bonding layer 115 may be formed below the melting point of the second bonding layer 310.

According to the method of manufacturing the semiconductor device package 400 of the embodiment, the bonding process between the semiconductor device 100 and the pad unit 210 can be performed at a first temperature of a relatively low temperature. Also, the bonding process between the semiconductor device 100 and the pad unit 210 may be performed while applying a relatively low first pressure.

In addition, the bonding process between the lead frame 220 and the main board 300 may be performed at a second temperature of a relatively high temperature. In addition, the bonding process between the lead frame 220 and the main board 300 may be performed while applying a relatively high second pressure.

However, as described above, since the melting point of the first bonding layer 115 is higher than the second temperature, the bonding force between the semiconductor device 100 and the pad unit 210 is not deteriorated in the reflow process for bonding between the lead frame 220 and the main board 300.

In addition, as described above, the bonding process between the semiconductor device 100 and the pad unit 210 can be performed at the relatively low first temperature. Therefore, according to the embodiment, it is possible to prevent the package body 230 from being damaged or discolored during the bonding process between the semiconductor device 100 and the pad unit 210.

According to the embodiment, the bonding process between the semiconductor device 100 and the pad unit 210 can be performed at a relatively low first temperature, so that the selection range for the material constituting the package body can be widened. According to the embodiment, the package body 230 may be provided using not only expensive materials such as ceramics but also relatively inexpensive resin materials.

For, example, the package body 230 may comprise at least one material selected from a group including PPA (polyphthalamide) resin, PCT (PolyCyclohexylenedimethylene Terephthalate) resin, EMC (Epoxy Molding Compound) resin, and SMC (Silicone Molding Compound) resin.

Meanwhile, the semiconductor device 100 according to the embodiment may be connected to the pad unit 210 by flip chip bonding method. The semiconductor device 100 may be top emission and side emission. Also, the semiconductor device 100 may emit light in a downward direction. Accordingly, the semiconductor device 100 of the embodiment may be a flip chip light emitting device that emits light in six directions.

Meanwhile, FIG. 8 is a view showing another example of a semiconductor device according to an embodiment of the present invention.

Then, referring to FIG. 8, another example of the semiconductor device according to the embodiment will be described. Referring to FIG. 8, in describing the semiconductor device according to the embodiment, description overlapping with those described with reference to FIGS. 1 to 7 may be omitted.

The semiconductor device 500 according to the embodiment may comprise a semiconductor layer 510, as shown in FIG. 8. The semiconductor device 500 shown in FIG. 8 shows only a partial region in which power is supplied to the semiconductor layer 510 from the outside. The semiconductor layer 510 may be provided as a first conductivity type semiconductor layer. Also, the semiconductor layer 510 may be provided as a second conductivity type semiconductor layer.

The semiconductor layer 510 may be provided as a compound semiconductor. For example, the semiconductor layer 510 may be formed of a Group II-VI compound semiconductor or a Group compound semiconductor. For example, the semiconductor layer 510 may comprise at least two elements selected from aluminum (Al), gallium (Ga), indium (In), phosphorous (P), arsenic (As), and nitrogen (Ni).

According to the embodiment, the semiconductor layer 510 may be provided of a semiconductor material having a composition formula of $In_xAl_yGa_{1-x-y}N$ ($0 \leq x \leq 1$, $0 \leq y \leq 1$, $0 \leq x+y \leq 1$). The semiconductor layer 510 may be selected from, for example, InAlGaN, InAlN, InGaN, AlGaN, GaN, and the like.

In addition, according to the embodiment, the semiconductor layer 510 may be provided of a semiconductor material having a composition formula of $(Al_xGa_{1-x})_yIn_{1-y}P$ ($0 \leq x \leq 1$, $0 \leq y \leq 1$). The semiconductor layer 110 may be selected from, for example, AlGaInP, AlInP, GaP, GaInP, and the like.

In addition, according to the embodiment, the semiconductor layer 510 may comprise an n-type dopant. For example, the semiconductor layer 510 may comprise at least one dopant selected from a group including Si, Ge, Sn, Se, Te, and the like. Also, the semiconductor layer 510 may comprise a p-type dopant. For example, the semiconductor layer 510 may comprise at least one dopant selected from a group including Mg, Zn, Ca, Sr, Ba, and the like.

The semiconductor device 500 according to the embodiment may comprise a metal layer 520, as shown in FIG. 8.

The metal layer 520 may be disposed on the semiconductor layer 510. The metal layer 510 may be provided as a single layer or as a plurality of layers. For example, the metal layer 510 may comprise at least one layer of an adhesive metal layer, a reflective metal layer, and a barrier metal layer.

According to the embodiment, the adhesive metal layer may comprise a material having an excellent adhesion to the semiconductor layer 510. The adhesive metal layer may comprise at least one selected from a group including materials such as Cr, Ti, and the like, or an alloy thereof. The adhesive metal layer may be provided as a single layer or a plurality of layers.

The reflective metal layer may comprise a material having high reflectivity with respect to a wavelength band of light emitted from the semiconductor device 500. The reflective metal layer may comprise at least one selected from a group including materials such as Al, Ag, Rh, and the like or an alloy thereof. The reflective metal layer may be provided as a single layer or as a plurality of layers.

The barrier metal layer may comprise a material capable of preventing a bonding material from diffusing into the semiconductor layer 510 during bonding of the semiconductor device 500 to a pad unit of a package body or the like. The barrier metal layer may comprise at least one selected from a group including materials such as Ni, Cr, Ti, Cu, Pt, Au, and the like, or an alloy thereof. The barrier metal layer may be provided as a single layer or as a plurality of layers.

In addition, the semiconductor device 500 according to the embodiment may comprise a porous metal layer 530, as shown in FIG. 8.

The porous metal layer 530 may be disposed on the metal layer 520. The porous metal layer 530 may comprise a plurality of pores. The porous metal layer 530 may be referred to as a metal sponge layer, which is a metal layer comprising a plurality of pores. The porous metal layer 530 may comprise at least one selected from a group including materials such as Au, Ag, Cu, and the like, or an alloy thereof.

The porous metal layer 530 may be formed of a metal layer having a plurality of pores, as described with reference to FIGS. 2 to 5. As shown in FIGS. 4 and 5, according to the porous metal layer 530 of the embodiment, a plurality of pores may be formed on the surface, and a plurality of pores may also be formed in the depth direction. For example, the porous metal layer 530 may be referred to as a metal sponge layer having a plurality of nano-scale pores.

According to the embodiment, the porous metal layer 530 may be provided in a thickness of several hundred nanometers to several tens of micrometers. For example, the porous metal layer 530 may be provided in a thickness of 500 nanometers to 10 micrometers. When the porous metal layer 530 is bonded to the Sn material, it may be appropriate to provide a thickness of 500 nm or more in order to prevent diffusion of Sn into the light emitting structure to prevent the light flux of the semiconductor device from being degraded, also, it may be appropriate to provide a thickness of less than 10 micrometers in order to prevent peeling between the semiconductor device and the package or peeling of the porous metal layer 530 itself, and to reduce the cost.

Meanwhile, according to the semiconductor device 500 of the embodiment, an additional conductive material that is electrically connected to the semiconductor layer 510 may be further provided between the metal layer 520 and the semiconductor layer 510. In addition, according to the semiconductor device 500 of another embodiment, the metal layer 520 may not be provided, and the porous metal layer 530 may be disposed in direct contact with the semiconductor layer 510.

In addition, the semiconductor device 500 according to the embodiment may comprise a bonding alloy layer 535, as shown in FIG. 8. The bonding alloy layer 535 may be disposed on the porous metal layer 530.

The semiconductor device 500 according to the embodiment may be attached to a submount or attached to a lead frame or the like, and supplied in the form of a semiconductor device package. At this time, the bonding alloy layer 535 may be electrically connected to a pad unit provided on the submount or a pad unit provided on the lead frame. For example, the bonding alloy layer 535 may be disposed in direct contact with the pad unit provided on the submount or the pad unit provided on the lead frame.

The bonding alloy layer 535 may comprise a plurality of metal materials. For example, the bonding alloy layer 535 may comprise a plurality of alloy layers including different material composition ratios. According to the bonding alloy layer 535, an atomic composition ratio of the material contained in a first alloy layer disposed in a first region that is closer to the porous metal layer 530, and an atomic composition ratio of the material contained in a second region that is disposed far away from the porous metal layer 530 may be provided to be different from each other.

For example, a thickness of the bonding alloy layer 535 may be provided in a range of several hundred nanometers to several tens of micrometers. The bonding alloy layer 535 may be provided in a thickness of 100 nanometers to 10 micrometers.

Meanwhile, according to the embodiment, the bonding alloy layer 535 may be formed during the deposition of the bonding metal layer on the porous metal layer 530. As described above, the semiconductor device 500 according to the embodiment may be attached to a submount or attached to a lead frame or the like, and supplied in the form of a semiconductor device package. At this time, the bonding metal layer may comprise a material capable of attaching the semiconductor device 500 according to the embodiment to a submount, a lead frame, or the like. For example, the bonding metal layer may comprise at least one selected from a group including Sn, In, and the like, which are materials of relatively low melting point, or an alloy thereof.

According to the embodiment, while the bonding metal layer 140 described with reference to FIGS. 1 to 5 is deposited on the porous metal layer 130, a material contained in the bonding metal layer 140 may diffuse into the porous metal layer 130. As the material included in the bonding metal layer 140 diffuses into the porous metal layer 130 and a region, where the material is combined with the porous metal layer 130, may be generated. For example, the porous metal layer 130 and the material diffused from the bonding metal layer 140 may be combined in the plurality of pores provided in the porous metal layer 130.

Accordingly, a partial region of the porous metal layer 130 shown in FIG. 1 can be formed corresponding to the bonding alloy layer 535 of the semiconductor device 500 according to the embodiment shown in FIG. 8. Also, the remaining region of the porous metal layer 130 shown in FIG. 1 may correspond to the porous metal layer 530 of the semiconductor device 500 according to the embodiment shown in FIG. 8.

Next, referring to FIGS. 9 and 10, the semiconductor device 500 according to the embodiment will be further described. FIG. 9 is an example of a SEM analysis photograph of a semiconductor device according to an embodiment of the present invention, and FIG. 10 is an example of a TEM analysis photograph of a semiconductor device according to an embodiment of the present invention.

A semiconductor device 500 according to the embodiment may comprise a porous metal layer 530, as shown in FIGS. 9 and 10. For example, the porous metal layer 530 may be formed based on a Au material. The porous metal layer 530 may be provided as a Au layer including a plurality of pores.

In addition, the semiconductor device 500 according to the embodiment may comprise a bonding alloy layer 535. The bonding alloy layer 535 may be disposed on the porous metal layer 530. The bonding alloy layer 535 may comprise a plurality of alloy layers including a plurality of metal materials and having different material composition ratios.

As an example, the bonding alloy layer 535 may comprise a first bonding alloy layer 535a and a second bonding alloy layer 535b. The first bonding alloy layer 535a may be disposed in a first region that is closer to the porous metal layer 530. The second bonding alloy layer 535b may be disposed in a second region that is relatively far from the porous metal layer 530 with reference to the first region. The second bonding alloy layer 535b may be disposed on the first bonding alloy layer 535a.

As an example, the bonding alloy layer 535 may comprise an alloy layer including Au and Sn. The first bonding alloy layer 535a and the second bonding alloy layer 535b may be provided as an alloy layer including Au and Sn. The bonding alloy layer 535 may comprise, for example, an AuSn alloy layer, and a composition ratio of Au:Sn may be provided of 9:1 or more and 2.5:7.5 or less based on at %.

According to the embodiment, in order to provide sufficient pores necessary for bonding, the composition ratio of Au:Sn requires a composition of 9:1 or more based on at %. Further, in order to maintain stable strength of the porous metal layer, the composition ratio of Au:Sn is required to be 2.5:7.5 or less based on at %.

The Au atomic composition ratio included in the second bonding alloy layer 535b may be smaller than the Au atomic composition ratio included in the first bonding alloy layer 535a. In addition, Sn atomic composition ratio included in the second bonding alloy layer 535b may be larger than Sn atomic composition ratio included in the first bonding alloy layer 535a.

As an example, the Au atomic composition ratio of the first bonding alloy layer 535a disposed in the first region may be 25 at % or more. In addition, the Au atomic composition ratio of the first bonding alloy layer 535a disposed in the first region may be 50 at % or less. For example, the Sn atomic composition ratio of the first bonding alloy layer 535a disposed in the first region may be 50 at % or more. Also, the Sn atomic composition ratio of the first bonding alloy layer 535a disposed in the first region may be 75 at % or less.

In addition, for example, the Au atomic composition ratio included in the second bonding alloy layer 535b disposed in the second region may be provided at 5 at % or more. In addition, the Au atomic composition ratio of the second bonding alloy layer 535b disposed in the second region may be 25 at % or less. For example, the Sn atomic composition ratio of the second bonding alloy layer 535b disposed in the second region may be 75 at % or more. The Sn atomic composition ratio of the second bonding alloy layer 535b disposed in the second region may be 95 at % or less.

According to the embodiment, as the second bonding alloy layer 535b disposed in the second region includes Au, when the semiconductor device package is later mounted secondarily on a main board or the like, the re-melting problem can be prevented. The solution to the re-melting problem in the semiconductor device package will be discussed later.

In addition, according to the embodiment, the bonding alloy layer 535 and the porous metal layer 530 described above can perform bonding to a semiconductor device of a predetermined size and provide a stable bonding force. For example, the lateral length of the semiconductor device according to the embodiment may be provided in a range of 250 micrometers to 3500 micrometers, and the vertical length of the semiconductor device may be provided in a range of 250 micrometers to 3500 micrometers.

According to the semiconductor device 500 of the embodiment, as shown in FIG. 10, the first bonding alloy layer 535a may be provided of a material composition ratio of 30 at % of Au and 70 at % of Sn, for example In addition, the second bonding alloy layer 535b may be provided of a material composition ratio of 25 at % of Au and 75 at % of Sn, for example. In the component analysis graph shown in FIG. 10, the solid line represents the Sn material, and the dotted line represents the Au material. Meanwhile, in FIGS. 9 and 10, the protective layer 550 disposed on the bonding alloy layer 535 is formed for stable analysis of the sample. For example, the protective layer 550 may be provided of a Pt layer.

In addition, the first bonding alloy layer 535a may be provided of a thickness of several hundred nanometers. For example, the first bonding alloy layer 535a may be provided a thickness of 120 nanometers. The second bonding alloy layer 535b may be provided of a thickness of several micrometers. As an example, the second bonding alloy layer 535b may be provided a thickness of 1.4 micrometers.

The porous metal layer 530 and the bonding alloy layer 535 according to the embodiment may be formed in the process of depositing a Sn bonding material on a Au based porous metal layer as described above. In the process of depositing the Sn material on the Au based porous metal layer, the Sn material may diffuse into the Au based porous metal layer to form the AuSn layer.

Accordingly, with reference to a Sn composition ratio in the first bonding alloy layer 535a disposed in a first region that is relatively closer to the porous metal layer 530, a Sn composition ratio in the second bonding alloy layer 535b disposed in a second region that is relatively far may be provided greater.

In addition, according to the embodiment, the porous metal layer 530 may comprise a Sn material by diffusion of the Sn bonding material. For example, the porous metal layer 530 may be provided with a Au atomic composition ratio of 90 at % or more. Also, the porous metal layer 530 may be provided with a Au atomic composition ratio of 95 at % or less. For example, the porous metal layer 530 may be provided with a Sn atomic composition ratio of 5 at % or more. Also, the porous metal layer 530 may be provided with a Sn atomic composition ratio of 10 at % or less.

According to the semiconductor device 500 of the embodiment, as shown in FIG. 10, the porous metal layer 530 may be provided of a material composition ratio of 95 at % of Au and 5 at % of Sn, for example. The thickness of the porous metal layer 530 may be, for example, 500 nanometers to 10 micrometers. According to the semiconductor device 500 of the embodiment, as shown in FIG. 10, the porous metal layer 530 may be provided with a thickness of 2.5 micrometers, for example.

According to the embodiment, the minimum thickness of the porous metal layer 530 is 500 nanometers, which may be a minimum thickness for enabling low temperature bonding in a semiconductor device packaging process. In addition, the maximum thickness of the porous metal layer 530 is 10 micrometers, which may be a maximum thickness at which low temperature bonding can be performed in the semiconductor device packaging process, and a proper bonding force can be ensured. For example, low temperature bonding can be performed in which the thickness of the porous metal layer 530 is greater than 10 micrometers, but after the bonding, the die shear test (DST) value is lowered, so there is a risk that the semiconductor device can easily be peeled off.

In addition, as shown in FIGS. 9 and 10, the semiconductor device 500 according to the embodiment may comprise a metal layer 520 and a semiconductor layer 510 disposed under the porous metal layer 530.

As an example, the metal layer 520 may comprise a first metal layer 520a and a second metal layer 520b.

The first metal layer 520a may comprise a layer of Ti/Au/Ti as a kind of adhesive metal layer. Each of the layers constituting the first metal layer 520a may be provided in a range of several tens of nanometers to several hundreds of nanometers. For example, the first metal layer 520a may be provided of a Ti layer with a thickness of 20 nanometers, a Au layer with a thickness of 200 nanometers, and a Ti layer with a thickness of 20 nanometers, as shown in FIGS. 9 and 10.

The second metal layer 520b may comprise Au as a kind of barrier metal layer. The second metal layer 520b may be provided a thickness of several micrometers. For example, the second metal layer 520b may be provided a thickness of 1.5 micrometers to 2 micrometers, as shown in FIGS. 9 and 10.

In addition, the semiconductor layer 510 may comprise, for example, a nitride semiconductor layer. The semiconductor layer 510 may comprise a GaN layer with a thickness of several micrometers, as shown in FIGS. 9 and 10.

Meanwhile, according to the embodiment, a bonding metal layer 540 may be further formed on the bonding alloy layer 535 as shown in FIG. 11. FIG. 11 is a view showing another example of a semiconductor device according to an embodiment of the present invention.

Then, another example of the semiconductor device according to the embodiment will be described with reference to FIG. 11. In describing the semiconductor device according to the embodiment with reference to FIG. 11, description overlapping with those described with reference to FIGS. 1 to 10 may be omitted.

The semiconductor device 500 according to the embodiment may comprise a semiconductor layer 510, as shown in FIG. 11. The semiconductor device 500 shown in FIG. 8 shows only a partial region in which power is supplied to the semiconductor layer 510 from the outside. The semiconductor layer 510 may be provided as a first conductivity type semiconductor layer. Also, the semiconductor layer 510 may be provided as a second conductivity type semiconductor layer.

In addition, the semiconductor device 500 according to the embodiment may comprise a metal layer 520 as shown in FIG. 11.

The metal layer 520 may be disposed on the semiconductor layer 510. The metal layer 510 may be provided as a single layer or as a plurality of layers. For example, the metal layer 510 may comprise at least one layer of an adhesive metal layer, a reflective metal layer, and a barrier metal layer.

In addition, the semiconductor device 500 according to the embodiment may comprise a porous metal layer 530, as shown in FIG. 11.

The porous metal layer 530 may be disposed on the metal layer 520. The porous metal layer 530 may comprise a plurality of pores. The porous metal layer 530 may be referred to as a metal sponge layer, which is a metal layer comprising a plurality of pores. The porous metal layer 530 may comprise at least one selected from a group including materials such as Au, Ag, Cu, and the like, or an alloy thereof.

In addition, the semiconductor device 500 according to the embodiment may comprise a bonding alloy layer 535 as shown in FIG. 11. The bonding alloy layer 535 may be disposed on the porous metal layer 530.

The bonding alloy layer 535 may comprise a plurality of metal materials. For example, the bonding alloy layer 535 may comprise a plurality of alloy layers including different material composition ratios. According to the bonding alloy layer 535, an atomic composition ratio of the material contained in a first alloy layer disposed in a first region that is closer to the porous metal layer 530, and an atomic composition ratio of the material contained in a second region that is disposed far away from the porous metal layer 530 may be provided to be different from each other.

In addition, the semiconductor device 500 according to the embodiment may comprise a bonding metal layer 540 as shown in FIG. 11. The bonding metal layer 540 may be disposed on the bonding alloy layer 535.

The semiconductor device 500 according to the embodiment may be attached to a submount or attached to a lead frame or the like, and supplied in the form of a semiconductor device package. At this time, the bonding metal layer 540 may be electrically connected to a pad unit provided on the submount or a pad unit provided on the lead frame. For example, the bonding metal layer 540 may be disposed in direct contact with the pad unit provided on the submount or the pad unit provided on the lead frame.

Meanwhile, according to the embodiment, the bonding alloy layer 535 may be formed during the deposition of the bonding metal layer 540 on the porous metal layer 530. As described above, the semiconductor device 500 according to the embodiment may be attached to a submount or attached to a lead frame or the like, and supplied in the form of a semiconductor device package. At this time, the bonding metal layer 540 may comprise a material capable of attaching the semiconductor device 500 according to the embodiment to a submount, a lead frame, or the like. For example, the bonding metal layer 540 may comprise at least one selected from a group including Sn, In, and the like, which are materials of relatively low melting point, or an alloy thereof.

According the embodiment, while the bonding metal layer 540 is deposited on the porous metal layer 530, a material contained in the bonding metal layer 540 may diffuse into the porous metal layer 530. As the material included in the bonding metal layer 540 diffuses into the porous metal layer 530 and a region, where the material is combined with the porous metal layer 530, may be generated. For example, the porous metal layer 530 and the material diffused from the bonding metal layer 540 may be combined in the plurality of pores provided in the porous metal layer 530.

The semiconductor device 500 according to the embodiment shown in FIG. 11 is different from the semiconductor device according to the embodiment described with reference to FIG. 8 in that the bonding metal layer 540 is disposed on the bonding alloy layer 535.

That is, in the semiconductor device according to the embodiment described with reference to FIG. 8, all of the deposited bonding metal layers are diffused into the porous metal layer, and a bonding alloy layer is formed in a part of the porous metal layer. However, in the semiconductor device according to the embodiment shown in FIG. 11, a part of the deposited bonding metal layer diffuses into the porous metal layer to form a bonding alloy layer, and a part of the deposited bonding metal layer is present on the bonding alloy layer.

Then, referring to FIGS. 12 and 13, the semiconductor device 500 according to the embodiment will be further described. FIG. 12 is another example of a SEM analysis photograph of a semiconductor device according to an embodiment of the present invention, and FIG. 13 is another example of a TEM analysis photograph of a semiconductor device according to an embodiment of the present invention.

A semiconductor device 500 according to the embodiment may comprise a porous metal layer 530, as shown in FIGS. 12 and 13. For example, the porous metal layer 530 may be formed based on a Au material. The porous metal layer 530 may be provided of a Au layer including a plurality of pores.

In addition, the semiconductor device 500 according to the embodiment may comprise a bonding alloy layer 535. The bonding alloy layer 535 may be disposed on the porous metal layer 530. The bonding alloy layer 535 may comprise a plurality of alloy layers including a plurality of metal materials and having different material composition ratios.

As an example, the bonding alloy layer 535 may comprise a first bonding alloy layer 535*a* and a second bonding alloy layer 535*b*. The first bonding alloy layer 535*a* may be disposed in a first region that is closer to the porous metal layer 530. The second bonding alloy layer 535*b* may be disposed in a second region that is relatively far from the porous metal layer 530 relative to the first region. The second bonding alloy layer 535*b* may be disposed on the first bonding alloy layer 535*a*.

As an example, the bonding alloy layer 535 may comprise an alloy layer including Au and Sn. The first bonding alloy layer 535*a* and the second bonding alloy layer 535*b* may be provided of an alloy layer including Au and Sn. The bonding alloy layer 535 may comprise, for example, an AuSn alloy layer, and the composition ratio of Au:Sn may be 9:1 or more and 2.5:7.5 or less based on at %.

The Au atomic composition ratio included in the second bonding alloy layer 535*b* may be smaller than the Au atomic composition ratio included in the first bonding alloy layer 535*a*. In addition, the Sn atomic composition ratio included in the second bonding alloy layer 535*b* may be larger than the Sn atomic composition ratio included in the first bonding alloy layer 535*a*.

As an example, the Au atomic composition ratio of the first bonding alloy layer 535*a* disposed in the first region may be 25 at % or more. In addition, the Au atomic composition ratio of the first bonding alloy layer 535a disposed in the first region may be 50 at % or less. For example, the Sn atomic composition ratio of the first bonding alloy layer 535a disposed in the first region may be 50 at % or more. The Sn atomic composition ratio of the first bonding alloy layer 535a disposed in the first region may be 75 at % or less.

In addition, for example, the Au atomic composition ratio of the second bonding alloy layer 535b disposed in the second region may be 5 at % or more. In addition, the Au atomic composition ratio of the second bonding alloy layer 535b disposed in the second region may be 25 at % or less. For example, the Sn atomic composition ratio of the second bonding alloy layer 535b disposed in the second region may be 75 at % or more. The Sn atomic composition ratio of the second bonding alloy layer 535b disposed in the second region may be 95 at % or less.

According to the semiconductor device 500 of the embodiment, as shown in FIG. 13, the first bonding alloy layer 535a may be provided of a material composition ratio of 30 at % of Au and 70 at % of Sn, for example. In addition, the second bonding alloy layer 535b may be provided of a material composition ratio of 20 at % of Au and 80 at % of Sn, for example. In the composition analysis graph shown in FIG. 13, the solid line represents the Sn material, and the dotted line represents the Au material. Meanwhile, in FIGS. 12 and 13, a protective layer 550 disposed on the bonding alloy layer 535 is formed for stable analysis of the sample. For example, the protective layer 550 may be provided of a Pt layer.

In addition, the first bonding alloy layer 535a may be provided of a thickness of several hundred nanometers. For example, the first bonding alloy layer 535a may be provided of a thickness of 490 nanometers. The second bonding alloy layer 535b may be provided of a thickness of several micrometers. For example, the second bonding alloy layer 535b may be provided of a thickness of 1.8 micrometers.

As described above, the porous metal layer 530 and the bonding alloy layer 535 according to the embodiment may be formed in the process of depositing a Sn based bonding metal layer 540 on a Au based porous metal layer. In the process of depositing the Sn based bonding metal layer 540 on the Au based porous metal layer, the Sn material diffuses into the Au based porous metal layer to form the AuSn layer.

Accordingly, with reference to a Sn composition ratio in the first bonding alloy layer 535a disposed in the first region that is relatively closer to the porous metal layer 530, a Sn composition ratio in the second bonding alloy layer 535b disposed in the second region that is relatively far may be provided greater.

In addition, according to the embodiment, the porous metal layer 530 may comprise a Sn material by diffusion of the Sn bonding material. For example, the porous metal layer 530 may be provided of a Au atomic composition ratio of 90 at % or more. Also, the porous metal layer 530 may be provided of a Au atomic composition ratio of 95 at % or less. For example, the porous metal layer 530 may be provided of a Sn atomic composition ratio of 5 at % or more. Also, the porous metal layer 530 may be provided of a Sn atomic composition ratio of 10 at % or less.

According to the semiconductor device 500 of the embodiment, as shown in FIG. 13, the porous metal layer 530 may be provided of a material composition ratio of, for example, 90 at % of Au and 10 at % of Sn. A thickness of the porous metal layer 530 may be provided of, for example, 500 nanometers to 10 micrometers. According to the semiconductor device 500 of the embodiment, as shown in FIG. 13, the porous metal layer 530 may be provided of a thickness of 2.2 micrometers as an example.

The semiconductor device 500 according to the embodiment may comprise a bonding metal layer 540 disposed on the bonding alloy layer 535 as shown in FIGS. 12 and 13.

As an example, the bonding metal layer 540 may be provided of 100 at % of Sn. In addition, a thickness of the bonding metal layer 540 may be provided of several micrometers. According to the semiconductor device 500 of the embodiment, as shown in FIG. 13, the bonding metal layer 540 may be provided of a thickness of 2.8 micrometers, for example.

Meanwhile, the semiconductor device 500 according to the embodiment may further comprise an additional Au layer provided on the bonding metal layer 540. A AuSn layer necessary for bonding can be easily provided by the bonding metal layer 540 and the Au layer in a semiconductor device packaging process to be described later.

For example, the Au layer may be provided of several micrometers or less. The Au layer may be provided of a thickness that does not exist as a Au layer in combination with the bonding metal layer 540 so that low temperature bonding can be performed in the packaging process. The Au layer may be provided of a thickness of 1 micrometer or less, for example, so that a AuSn layer can be formed by combination with the remaining bonding metal layer 540 and bonding strength with a pad unit can be improved during the packaging process.

In addition, the semiconductor device 500 according to the embodiment may comprise a metal layer 520 and a semiconductor layer 510 disposed under the porous metal layer 530 as shown in FIGS. 12 and 13.

For example, the metal layer 520 may comprise a first metal layer 520a and a second metal layer 520b. The first metal layer 520a may comprise a Ti/Au/Ti layer as a kind of adhesive metal layer. Each of the layers constituting the first metal layer 520a may be provided in a range of several tens of nanometers to several hundreds of nanometers. The second metal layer 520b may comprise Au as a kind of barrier metal layer. The second metal layer 520b may be provided of a thickness of several micrometers.

In addition, the semiconductor layer 510 may comprise, for example, a nitride semiconductor layer. The semiconductor layer 510 may comprise a GaN layer of several micrometers, as shown in FIGS. 12 and 13.

Meanwhile, the semiconductor device 500 according to the embodiment described above may be attached to a submount or attached to a lead frame or the like, and supplied in the form of a semiconductor device package. At this time, the bonding alloy layer 535 or the bonding metal layer 540 may be electrically connected to a pad unit provided on the submount or a pad unit provided on the lead frame. For example, the bonding alloy layer 535 or the bonding metal layer 540 may be disposed in direct contact with the pad unit provided on the submount or the pad unit provided on the lead frame.

As an example, the bonding alloy layer 535 or the bonding metal layer 540 may be connected to the pad unit by a die bonding method. In addition, the bonding alloy layer 535 or the bonding metal layer 540 may be connected to the pad unit by a flip chip bonding method.

Then, referring to FIG. 14, another example of a semiconductor device package according to an embodiment will be described. FIG. 14 is a view showing another example of the semiconductor device package according to the embodiment of the present invention.

Referring to FIG. 14, in explaining the semiconductor device package according to the embodiment, description overlapping with those described with reference to FIGS. 1 to 13 may be omitted.

The semiconductor device package 600 according to the embodiment may comprise a pad unit 210, as shown in FIG. 14. The semiconductor device package 600 shown in FIG. 14 shows only a partial region around the pad unit 210 that supplies power to the semiconductor device 500.

As an example, the pad unit 210 may be provided on the submount. Also, the pad unit 210 may be provided on the lead frame. Also, the pad unit 210 may be provided on a circuit board.

According to a method of manufacturing a semiconductor device package of the embodiment, the semiconductor device 500 described with reference to FIGS. 8 to 13 may be provided on the pad unit 210. At this time, the bonding alloy layer 535 described with reference to FIG. 8 or the bonding metal layer 540 described with reference to FIG. 11 may be provided to be in direct contact with the pad unit 210.

As an example, according to the method of manufacturing the semiconductor device package of the embodiment, an additional bonding material such as an additional bump for bonding may not be provided between the semiconductor device 500 and the pad unit 210. Thus, according to the method of manufacturing the semiconductor device of the embodiment, the manufacturing process can be simplified and the manufacturing cost can be reduced.

According to the method of manufacturing the semiconductor device package of the embodiment, at least one of heat or pressure may be provided in the state where the bonding alloy layer 535 described with reference to FIG. 8 or the bonding metal layer 540 described with reference to FIG. 11 is disposed on the pad unit 210.

First, a process of bonding the bonding alloy layer 535 described with reference to FIG. 8 to the pad unit 210 will be described.

According to the embodiment, through a reflow process or the like, at least one of heat or pressure is provided between the bonding alloy layer 535 described with reference to FIG. 8 and the pad unit 210, so that the bonding material included in the bonding alloy layer 535 may be diffused into the porous metal layer 530. The bonding alloy layer formed by bonding between the bonding material diffused from the bonding alloy layer 535 and the material contained in the porous metal layer 530 is expanded in a plurality of pore regions provided in the porous metal layer 530, so that the porous metal layer 630 and the bonding alloy layer 635 shown in FIG. 14 may be formed.

As an example, the thickness of the porous metal layer 630 shown in FIG. 14 may be reduced compared to the porous metal layer 530 shown in FIG. 8. In addition, the thickness of the bonding alloy layer 635 shown in FIG. 14 may be increased compared to the bonding alloy layer 535 shown in FIG. 8. In addition, as the bonding material contained in the bonding alloy layer 635 is diffused into the pad unit 210, the bonding alloy layer 635 can be stably bonded to the surface of the pad unit 210.

According to the embodiment, as shown in FIGS. 15 and 16, a change may occur in the thickness of each layer before and after the reflow process. FIG. 15 is an SEM analysis photograph showing a state before the semiconductor device is bonded to the pad unit in the semiconductor device package according to the embodiment of the present invention, and FIG. 16 is an SEM analysis photograph showing a state after the semiconductor device is bonded to the pad unit in the semiconductor device package according to the embodiment of the present invention.

For example, the semiconductor device before the reflow process may comprise a semiconductor layer 510, a metal layer 520, a porous metal layer 530, and a bonding alloy layer 535, as shown in FIG. 15. Also, the semiconductor device after the reflow process may comprise a semiconductor layer 510, a metal layer 520, a porous metal layer 630, and a bonding alloy layer 635 as shown in FIG. 16.

According to the embodiment, the porous metal layer 530 shown in FIG. 15 may be formed based on Au, and may be provided of a thickness of 2.5 micrometers, for example. In addition, the bonding alloy layer 535 shown in FIG. 15 may be formed of a AuSn alloy layer, and may be provided of a thickness of 1.6 micrometers, for example.

According to the embodiment, the porous metal layer 630 shown in FIG. 16 may be formed based on Au, and may be provided of a thickness of, for example, 2.1 micrometers. That is, it can be seen that the thickness of the porous metal layer 630 shown in FIG. 16 is reduced compared to the thickness of the porous metal layer 530 shown in FIG. 15 through the reflow process.

Also, the bonding alloy layer 635 shown in FIG. 16 may be formed of a AuSn alloy layer, and may be provided of a thickness of 2.0 micrometers, for example. That is, it can be seen that the thickness of the bonding alloy layer 635 shown in FIG. 16 is increased compared with the thickness of the bonding alloy layer 535 shown in FIG. 15 through the reflow process.

Meanwhile, as described with reference to FIG. 10, the bonding alloy layer 535 may comprise a plurality of alloy layers, and, according to the embodiment, each thickness of the plurality of alloy layers may be increased through the reflow process. That is, when the bonding alloy layer 535 comprises a first bonding alloy layer 535a and a second bonding alloy layer 535b, each thickness of the first bonding alloy layer and the second bonding alloy layer can be increased through the reflow process.

According to the method of manufacturing the semiconductor device package of the embodiment, a kind of eutectic bonding may be performed between the semiconductor device 500 and the pad unit 210. According to the embodiment, as the AuSn alloy layer is formed in the porous metal layer 530 including a plurality of pores, the bonding process can be performed at a lower temperature and a lower pressure than the commonly known eutectic bonding.

According to the embodiment, the bonding alloy layer 635 may be formed of a AuSn alloy layer, and may have a relatively higher melting point than the Sn material based bonding metal.

As an example, the melting point of the Sn material based bonding metal may be in a range of 220 degrees to 250 degrees. In addition, the bonding alloy layer 635 may have a higher melting point than 250 degrees. The melting point of the bonding alloy layer 635 can be flexibly selected through adjustment of the composition ratio of the material constituting the bonding alloy layer 635.

Next, a process of bonding the bonding metal layer 540 described with reference to FIG. 11 to the pad unit 210 will be described.

According to the embodiment, through a reflow process or the like, at least one of heat or pressure is provided between the bonding metal layer 540 with reference to FIG. 11 and the pad unit 210 described so that the bonding material contained in the bonding metal layer 540 may be diffused into the porous metal layer 530. The bonding alloy layer formed by bonding between the bonding material diffused from the bonding metal layer 540 and the material contained in the porous metal layer 530 is expanded in a plurality of pore regions provided in the porous metal layer 530, so that the porous metal layer 630 and bonding alloy layer 635 shown in FIG. 14 may be formed.

As an example, the thickness of the porous metal layer 630 shown in FIG. 14 may be reduced compared to the porous metal layer 530 shown in FIG. 11. Also, the thickness of the bonding alloy layer 635 shown in FIG. 14 may be increased compared to the bonding alloy layer 535 shown in FIG. 11. In addition, the bonding metal layer 540 shown in FIG. 11 may not be present as shown in FIG. 14 through the reflow process. That is, all of the bonding material contained in the bonding metal layer 540 may be diffused into the bonding alloy layer 635 or the porous metal layer 630, so that the bonding material may not be exist. Also, the bonding material contained in the bonding metal layer 540 may be diffused into the pad unit 210, and the bonding alloy layer 635 may be stably bonded to the surface of the pad unit 210.

Meanwhile, according to another embodiment, the bonding metal layer 540 shown in FIG. 11 may be exist between the bonding alloy layer 635 and the pad unit 210 through the reflow process, unlike a case shown in FIG. 14. At this time, the thickness of the bonding metal layer existing between the bonding alloy layer 635 and the pad unit 210 may be limited in a range of several tens of nanometers to several hundreds of nanometers. If the thickness of the bonding metal layer is greater than 1 micrometer, there may arise a problem that the bonding metal layer is re-melted in the process of re-bonding the semiconductor device package to a circuit board or the like.

Therefore, in the semiconductor device package 600 according to the embodiment, the bonding metal layer is not present and the bonding alloy layer 635 is brought into direct contact with the pad unit 210, so that it is possible to prevent the problem of re-melting from occurring in the process of re-bonding the semiconductor device package to the substrate.

In addition, according to the semiconductor device package 600 of the embodiment, the bonding metal layer can be exist to be less than 1 micrometer between the boding alloy layer 635 and the pad unit 210, so that it is possible to prevent a problem of re-melting in the process of re-bonding the semiconductor device package to a substrate or the like.

As an example, the re-melting problem described above can occur in the following environment.

The semiconductor device package 600 according to the embodiment may be additionally surface mounted (SMT) and attached to a main substrate that supplies power, according to the application product. At this time, as an example, the semiconductor device package 600 may be surface mounted (SMT) to the main board by soldering or the like.

Meanwhile, according to the conventional method of manufacturing a semiconductor device package, the semiconductor device is bonded to a pad unit through a bonding process. In the case where the bonding is performed through a first bonding process in the process of manufacturing the semiconductor device package, in the reflow process for a second bonding process in which the surface mounting is further performed on the main substrate, so that the bonding material used in the first bonding process can be melted again.

Accordingly, in the reflow process for the second bonding process, the stability of the electrical connection and the physical connection between the semiconductor device package and the pad unit can be weakened.

However, according to the method of manufacturing the semiconductor device package, a melting point of the bonding alloy layer 635 that provides the bonding force between the semiconductor device 500 of the embodiment and the pad unit 210 may be provided higher than the melting point of the common bonding material. Therefore, even when the semiconductor device package 600 according to the embodiment is bonded to the main board through a reflow process, re-melting phenomenon does not occur, so that there are advantages that electrical connection and physical bonding force are not deteriorated.

Meanwhile, according to the application example of the semiconductor device package 600 of the embodiment, the pad unit 210 may be disposed on a resin, and the pad unit 210 may be disposed around a resin. Accordingly, when the pad unit 210 and the semiconductor device 500 are coupled at a high temperature, deformation of the resin may occur or discoloration may occur in the resin.

However, according to the semiconductor device package 600 of the embodiment, as described above, the semiconductor device 500 can be bonded to the pad unit 210 in a low temperature environment. Thus, according to the embodiment, the resin disposed around the pad unit can be prevented from being exposed to high temperature, so that the resin can be prevented from being damaged or discolored.

Meanwhile, FIG. 17 is a view showing another example of a semiconductor device package according to an embodiment of the present invention.

Then, referring to FIG. 17, another example of the semiconductor device package according to the embodiment will be described. In describing the semiconductor device package according to the embodiment with reference to FIG. 17, description overlapping with those described with reference to FIGS. 1 to 16 may be omitted.

The semiconductor device package 700 according to the embodiment may comprise a semiconductor device 500, a pad unit 210, a lead frame 220, a package body 230, and a main board 300, as shown in FIG. 17.

The semiconductor device 500 may be electrically connected to the pad unit 210 provided in the package body 230 including the recess. For example, the pad unit 210 may be provided on a bottom surface of the recess provided in the package body 230.

The pad unit 210 may be electrically connected to the main board 300 disposed below. For example, the pad unit 210 may be electrically connected to the main board 300 through the lead frame 220 disposed below.

The semiconductor device 500 may be disposed on the pad unit 210 provided on the lead frame 220. The semiconductor device 500 may be disposed in a recess provided by the package body 230. A molding unit 240 may be disposed on the semiconductor device 500. For example, the molding unit 240 may comprise a wavelength conversion particle that receives light provided from the semiconductor device 500 and emits wavelength converted light.

As shown in FIG. 17, the semiconductor device package 700 according to the embodiment may comprise a first bonding layer 715 disposed on the pad unit 210 and a second bonding layer 310 disposed under the lead frame 220.

As an example, the first bonding layer 715 may comprise a bonding metal layer 635 and a porous metal layer 630 described with reference to FIGS. 8 to 16. In addition, the second bonding layer 310 may comprise a bonding material used in a soldering process. For example, the second bonding layer 310 may comprise at least one selected from low melting point bonding materials including Sn and In, or an alloy thereof.

According to the embodiment, the first bonding layer 715 may have a higher melting point than the second bonding layer 310, as described with reference to FIGS. 8 to 16. Also, the first bonding layer 715 may be formed below the melting point of the second bonding layer 310.

According to the method of manufacturing the semiconductor device package 700 of the embodiment, the bonding process between the semiconductor device 500 and the pad unit 210 can be performed at a first temperature that is a relatively low temperature. Also, the bonding process between the semiconductor device 500 and the pad unit 210 may be performed while applying a first pressure that is a relatively low pressure.

In addition, the bonding process between the lead frame 220 and the main board 300 can be performed at a second temperature that is a relatively high temperature. In addition, the bonding process between the lead frame 220 and the main board 300 may be performed while applying a second pressure that is a relatively high pressure.

However, as described above, since the melting point of the first bonding layer 715 is higher than the second temperature, in the reflow process for the bonding between the lead frame 220 and the main board 300, the bonding force between the semiconductor device 500 and the pad unit 210 is not deteriorated.

In addition, as described above, the bonding process between the semiconductor device 500 and the pad unit 210 can be performed at the first temperature that is a relatively low temperature. Accordingly, according to the embodiment, it is possible to prevent the package body 230 from being damaged or discolored during the bonding process between the semiconductor device 500 and the pad unit 210.

According to the embodiment, the bonding process between the semiconductor device 500 and the pad unit 210 can be performed at the first temperature that is a relatively low temperature and thus the selection range for the material constituting the package body 230 can be widened. According to the embodiment, the package body 230 may be provided using not only expensive materials such as ceramics but also relatively inexpensive resin materials.

Meanwhile, the semiconductor device 500 according to the embodiment may be connected to the pad unit 210 by a flip chip bonding method. The semiconductor device 500 may be top emission and side emission. Also, the semiconductor device 500 may emit light in a downward direction. As described above, the semiconductor device 500 according to the embodiment may be a flip chip light emitting device that emits light in six directions.

Then, another example of a semiconductor device according to an embodiment of the present invention will be described with reference to FIGS. 18 to 22. In describing the semiconductor device according to the embodiment with reference to FIG. 18 to FIG. 22, description overlapping with those described with reference to FIGS. 1 to 17 may be omitted.

FIG. 18 is a plan view showing still another example of the semiconductor device according to the embodiment of the present invention, and FIG. 19 is a sectional view taken along line A-A of the semiconductor device shown in FIG. 18.

Meanwhile, for the sake of understanding, FIG. 18 is illustrated so that a first electrode electrically connected to a first bonding pad 1171 and a second electrode electrically connected to a second boding pad 1172 can be seen, even though which are disposed under the first bonding pad 1171 and the second bonding pad 1172.

In the semiconductor device according to the embodiment, the first bonding pad 1171 and the second bonding pad 1172 may comprise the porous metal layer and the bonding alloy layer described above as an example. In addition, the first bonding pad 1171 and the second bonding pad 1172 according to the embodiment may comprise all of the metal layer, the porous metal layer, and the bonding alloy layer described above.

The semiconductor device 1100 according to the embodiment may comprise a light emitting structure 1110 disposed on a substrate 1105, as shown in FIGS. 18 and 19.

The substrate 1105 may be selected from a group including a sapphire substrate ($Al_2O_3$), SiC, GaAs, GaN, ZnO, Si, GaP, InP, and Ge. For example, the substrate 1105 may be provided as a patterned sapphire substrate (PSS) having a concavo-convex pattern formed on its upper surface.

The light emitting structure 1110 may comprise a first conductivity type semiconductor layer 1111, an active layer 1112, and a second conductivity type semiconductor layer 1113. The active layer 1112 may be disposed between the first conductivity type semiconductor layer 1111 and the second conductivity type semiconductor layer 1113. For example, the active layer 1112 may be disposed on the first conductivity type semiconductor layer 1111, and the second conductivity type semiconductor layer 1113 may be disposed on the active layer 1112.

According to the embodiment, the first conductivity type semiconductor layer 1111 may be provided of an n-type semiconductor layer, and the second conductivity type semiconductor layer 1113 may be provided of a p-type semiconductor layer. Of course, according to another embodiment, the first conductivity type semiconductor layer 1111 may be provided of a p-type semiconductor layer, and the second conductivity type semiconductor layer 1113 may be provided of an n-type semiconductor layer.

Hereinafter, for convenience of description, an embodiment will be described based on a case where the first conductivity type semiconductor layer 1111 is provided of an n-type semiconductor layer and the second conductivity type semiconductor layer 1113 is provided of a p-type semiconductor layer.

In addition, in the above description, the case where the first conductivity type semiconductor layer 1111 is disposed in contact with the substrate 1105 has been described. However, a buffer layer may be further disposed between the first conductivity type semiconductor layer 1111 and the substrate 1105. For example, the buffer layer can reduce the difference in lattice constant between the substrate 1105 and the light emitting structure 1110 and improve crystallinity.

The light emitting structure 1110 may be provided of a compound semiconductor. For example, the light emitting structure 1110 may be provided of a Group II-VI or a Group III-V compound semiconductor. For example, the light emitting structure 1110 may comprise at least two elements selected from aluminum (Al), gallium (Ga), indium (In), phosphorous (P), arsenic (As), and nitrogen (Ni).

For example, the first conductivity type semiconductor layer 1111 may be provided of a Group II-VI compound semiconductor or a Group III-V compound semiconductor. For example, the first conductivity type semiconductor layer 1111 may be provided of a semiconductor material having a composition formula of $In_xAl_yGa_{1-x-y}N$ ($0 \leq x \leq 1$, $0 \leq y \leq 1$, $0 \leq x+y \leq 1$) or a semiconductor material having a composition formula of $(Al_xGa_{1-x})_yIn_{1-y}P$ ($0 \leq x \leq 1$, $0 \leq y \leq 1$). For example, the first conductivity type semiconductor layer 1111 may be selected from a group including GaN, AlN, AlGaN, InGaN, InN, InAlGaN, AlInN, AlGaAs, GaP, GaAs, GaAsP, AlGaInP, AlInP, GaInP, and the like, and an n-type dopant selected from a group including Si, Ge, Sn, Se, Te, and the like may be doped.

The active layer 1112 may be provided, for example, as a Group II-VI compound semiconductor or a Group III-VI compound semiconductor. For example, the active layer 1112 may be provided of a semiconductor material having a composition formula of $In_xAl_yGa_{1-x-y}N$ (0≤x≤1, 0≤y≤1, 0≤x+y≤1) or a semiconductor material having a composition formula of $(Al_xGa_{1-x})_yIn_{1-y}P$ (0≤x≤1, 0≤y≤1). For example, the active layer 1112 may be selected from a group including GaN, AlN, AlGaN, InGaN, InN, InAlGaN, AlInN, AlGaAs, GaP, GaAs, GaAsP, AlGaInP, AlInP, GaInP, and the like. For example, the active layer 1112 may be provided of a multi-well structure, and may comprise a plurality of barrier layers and a plurality of well layers.

The second conductivity type semiconductor layer 1113 may be provided, for example, as a Group II-VI compound semiconductor or a Group III-V compound semiconductor. For example, the second conductivity type semiconductor layer 1113 may be provided of a semiconductor material having a composition formula of $In_xAl_yGa_{1-x-y}N$ (0≤x≤1, 0≤y≤1, 0≤x+y≤1) or a semiconductor material having a composition formula of $(Al_xGa_{1-x})_yIn_{1-y}P$ (0≤x≤1, 0≤y≤1). For example, the second conductivity type semiconductor layer 1113 may be selected from a group including GaN, AlN, AlGaN, InGaN, InN, InAlGaN, AlInN, AlGaAs, GaP, GaAs, GaAsP, AlGaInP, AlInP, GaInP, and the like, and a p-type dopant selected from a group including Mg, Zn, Ca, Sr, Ba, and the like may be doped.

The semiconductor device 1100 according to the embodiment may comprise a current diffusion layer 1120 and an ohmic contact layer 1130 as shown in FIG. 19. The current diffusion layer 1120 and the ohmic contact layer 1130 can improve current spreading to increase light output.

As an example, the current diffusion layer 1120 may be provided of an oxide, a nitride, or the like. A width of the current diffusion layer 1120 may be provided not less than a width of the second electrode 1142 disposed above. Accordingly, the current diffusion layer 1120 can improve the luminous flux by preventing the current concentration at the region under the second electrode 1142 and improving the electrical reliability.

In addition, the ohmic contact layer 1130 may comprise at least one selected from a group including a metal, a metal oxide, and a metal nitride. The ohmic contact layer 1130 may comprise a light-transmitting material. For example, the ohmic contact layer 1130 may comprise at least one of indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

The semiconductor device 1100 according to the embodiment may comprise a first electrode 1141 and a second electrode 1142, as shown in FIGS. 18 to 20.

The first electrode 1141 may be electrically connected to the first conductivity type semiconductor layer 1111. The first electrode 1141 may be disposed on the first conductivity type semiconductor layer 1111. For example, in the semiconductor device 1100 according to the embodiment, the first electrode 1141 may be disposed on an upper surface of the first conductivity type semiconductor layer 1111, which is exposed by removing a part of the second conductivity type semiconductor layer 1113 and a part of the active layer 1112.

In addition, according to the embodiment, the first electrode 1141 may be disposed on a recess, which exposes a portion of the first conductivity type semiconductor layer 1111 by penetrating through the second conductivity type semiconductor layer 1113 and the active layer 1112.

The second electrode 1142 may be electrically connected to the second conductivity type semiconductor layer 1113. The second electrode 1142 may be disposed on the second conductivity type semiconductor layer 1113. According to the embodiment, the current diffusion layer 1120 may be disposed between the second electrode 1142 and the second conductivity type semiconductor layer 1113. In addition, the second electrode 1142 may be disposed on the ohmic contact layer 1130.

The first electrode 1141 and the second electrode 1142 may be formed as a single layer or a multilayer structure. For example, the first electrode 1141 and the second electrode 1142 may be ohmic electrodes. For example, the first electrode 1141 and the second electrode 1142 may be at least one of ZnO, IrOx, RuOx, NiO, RuOx/ITO, Ni/IrOx/Au/ITO, Ni/IrOx/Au, Ni/IrOx/Au/ITO, Ag, Ni, Cr, Ti, Al, Rh, Pd, Ir, Ru, Mg, Zn, Pt, Au, and Hf, or an alloy of two or more of them.

In addition, according to the embodiment, the first electrode 1141 and the second electrode 1142 may further comprise branch electrodes branched from each other. The first electrode 1141 and the second electrode 1142 can prevent the concentration of current through the branch electrodes and diffuse the current flow.

The semiconductor device 1100 according to the embodiment may comprise a protective layer 1150, as shown in FIGS. 18 and 19.

The protective layer 1150 may be disposed on the second electrode 1142. The protective layer 1150 may comprise a first opening h1 that exposes an upper portion of the P region of the second electrode 1142.

In addition, the protective layer 1150 may be disposed on the first electrode 1141. The protective layer 1150 may comprise a second opening h2 that exposes an upper portion of the N region of the first electrode 1141.

For example, the protective layer 1150 may be provided of an insulating material. For example, the protective layer 1150 may be formed of at least one material selected from a group including $SiO_2$, $SiO_x$, $SiO_xN_y$, $Si_3N_4$, and $Al_2O_3$.

In addition, the semiconductor device 1100 according to the embodiment may comprise a reflective layer 1160, as shown in FIGS. 18, 19, and 21. The reflective layer 1160 may comprise a first reflective layer 1161, a second reflective layer 1162, and a third reflective layer 1163. The reflective layer 1160 may be disposed on the protective layer 1150.

The first reflective layer 1161 may be disposed on the first electrode 1141 and the second electrode 1142. The first reflective layer 1161 may be disposed on a portion of the first electrode 1141. The first reflective layer 1161 may be disposed on a portion of the second electrode 1142.

The first reflective layer 1161 may comprise a fourth opening h4 that exposes an upper surface of the first electrode 1141. The first reflective layer 1161 may comprise the fourth opening h4 provided corresponding to an area where the second opening h2 of the protective layer 1150 is formed.

The second reflective layer 1162 may be disposed on the first electrode 1141 and the second electrode 1142. The second reflective layer 1162 may be disposed on a portion of the first electrode 1141. The second reflective layer 1162 may be disposed on a portion of the second electrode 1142.

The second reflective layer 1162 may be spaced apart from the first reflective layer 1161. The second reflective layer 1162 may comprise a third opening h3 that exposes an upper surface of the second electrode 1142. The second reflective layer 1162 may comprise the third opening h3 provided corresponding to an area where the first opening h1 of the protection layer 1150 is formed.

In addition, the third reflective layer 1163 may be disposed on the first electrode 1141 and the second electrode 1142. The third reflective layer 1163 may be disposed on a portion of the first electrode 1141. The third reflective layer 1163 may be disposed on a portion of the second electrode 1142.

The third reflective layer 1163 may be disposed between the first reflective layer 1161 and the second reflective layer 1162. For example, the third reflective layer 1163 may be connected to the first reflective layer 1161. Also the third reflective layer 1163 may be connected to the second reflective layer 1162. The third reflective layer 1163 may be physically in direct contact with the first reflective layer 1161 and the second reflective layer 1162.

The reflective layer 1160 may be provided of an insulating reflective layer. For example, the reflective layer 1160 may be provided of a Distributed Bragg Reflector DBR) layer or an Omni Directional Reflector (ODR) layer. Also, the reflective layer 1160 may comprise a metal material.

According to the embodiment, the first reflective layer 1161 may be disposed on a side surface and a part of an upper surface of the first electrode 1141 to expose the upper surface of the first electrode 1141. The second reflective layer 1162 may be disposed on a side surface and a part of an upper surface of the second electrode 1142 to expose the upper surface of the second electrode 1142.

Accordingly, the first reflective layer 1161 and the second reflective layer 1162 reflect light emitted from the active layer 1112 of the light emitting structure 1110 to minimize light absorption by the first bonding pad 1171 and the second bonding pad 1172, thereby improving the luminous intensity Po.

For example, the first reflective layer 1161 and the second reflective layer 1162 are made of an insulating material, and a material having a high reflectivity, for example, a DBR structure may be formed to reflect light emitted from the active layer 1112. Also, the third reflective layer 1163 may have a DBR structure as an example.

The first reflective layer 1161 and the second reflective layer 1162 may have a DBR structure in which materials having different refractive indexes are repeatedly arranged. For example, the first reflective layer 1161 and the second reflective layer 1162 may be disposed in a single layer or a stacked structure including at least one of $TiO_2$, $SiO_2$, $Ta_2O_5$, and $HfO_2$.

In addition, according to another embodiment, it is not limited above, the first reflective layer 1161 and the second reflective layer 1162 may be provided freely so as to control the reflectivity of light emitted from the active layer 1112 according to the wavelength of the light emitted from the active layer 1112.

The semiconductor device 1100 according to the embodiment may comprise the first bonding pad 1171 disposed on the first reflective layer 1161 as shown in FIGS. 18 and 19. In addition, the semiconductor device 1100 according to the embodiment may comprise the second bonding pad 1172 disposed on the second reflective layer 1162. The second bonding pad 1172 may be spaced apart from the first bonding pad 1171.

The first bonding pad 1171 may contact an upper part of the N region of the first electrode 1141 through the fourth opening h4 and the second opening h2. The second bonding pad 1172 may contact an upper portion of the P region of the second electrode 1142 through the third opening h3 and the first opening h1.

The semiconductor device according to the embodiment may be connected to an external power source in a flip chip bonding manner. For example, in manufacturing the semiconductor device package, an upper surface of the first bonding pad 1171 and an upper surface of the second electrode pad 172 may be disposed to attach to a submount, a lead frame, a circuit board, and the like.

For example, the first bonding pad 1171 and the second bonding pad 1172 may comprise the porous metal layer and the bonding alloy layer described with reference to FIGS. 1 to 17. The description of the porous metal layer and the bonding alloy layer described with reference to FIGS. 1 to 17 can be applied to the first bonding pad 1171 and the second bonding pad 1172.

In addition, according to another embodiment, the first bonding pad 1171 and the second bonding pad 1172 may be formed of Au, AuTi, or the like, so that the packaging process can stably proceed. Also, the first bonding pad 1171 and the second bonding pad 1172 may be formed of a layer or multilayer using at least one of Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, Ni/IrOx/Au/ITO, and the like, or an alloy thereof.

When the semiconductor device according to the embodiment is mounted by a flip chip bonding method and is implemented as a semiconductor device package, the light provided by the light emitting structure 1110 may be emitted through the substrate 1105. Light emitted from the light emitting structure 1110 may be reflected by the first reflective layer 1161 and the second reflective layer 1162 and may be emitted toward the substrate 1105.

In addition, the light emitted from the light emitting structure 1110 may be emitted in the lateral direction of the light emitting structure 1110. Also, the light emitted from the light emitting structure 1110 may be emitted to the outside through a region where the first bonding pad 1171 and the second bonding pad 1172 are not provided, among the surfaces on which the first bonding pad 1171 and the second bonding pad 1172 are disposed.

Specifically, the light emitted from the light emitting structure 1110 may be emitted through a region where the first reflective layer 1161, the second reflective layer 1172, and the third reflective layer 1173 are not provided, among the surfaces on which the first bonding pad 1171 and the second bonding pad 1172 are disposed.

Accordingly, the semiconductor device 1100 according to the embodiment can emit light in six directions surrounding the light emitting structure 1110, and the luminous intensity can be remarkably improved.

In addition, according to the semiconductor device and the semiconductor device package of the embodiment, since the first bonding pad 1171 and the second bonding pad 1172 having a large area can be directly bonded to the circuit board providing power, the flip chip bonding process can be performed easily and stably.

Meanwhile, in the description of the semiconductor device according to the embodiment, the case where the ohmic contact layer 1130 is provided on the second conductivity type semiconductor layer 1113 has been described. However, according to another embodiment, the ohmic contact layer 1130 may be omitted and the second electrode 1142 may be disposed on and directly contacted with the second conductivity type semiconductor layer 1113.

Then, referring to FIG. 22, the arrangement relationship of the first bonding pad 1171 and the second bonding pad 1172 applied to the semiconductor device 1100 according to the embodiment will be further described. FIG. 22 is a view showing an example of the arrangement of the first bonding pad 1171 and the second bonding pad 1172 applied to the semiconductor device according to the embodiment of the present invention.

According to the semiconductor device 1100 of the embodiment, when viewed from above the semiconductor device 1100, the sum of the area of the first bonding pad 1171 and the area of the second bonding pad 1172 may be provided equal to or smaller than 60% of the total area of the upper surface of the semiconductor device 1100 on which the first bonding pad 1171 and the second bonding pad 1172 are disposed.

For example, the total area of the upper surface of the semiconductor device 1100 may correspond to an area defined by a lateral length and a longitudinal length of the lower surface of the first conductivity type semiconductor layer 1111 of the light emitting structure 1110. Also, the total area of the upper surface of the semiconductor device 1100 may correspond to the area of the upper surface or the lower surface of the substrate 1105.

As described, the sum of the areas of the first bonding pad 1171 and the second bonding pad 1172 is provided equal to or smaller than 60% of the total area of the semiconductor device 1100, so that the amount of light emitted to the surface where the first bonding pad 1171 and the second bonding pad 1172 are disposed can be increased. Accordingly, according to the embodiment, since the amount of light emitted in the six surface direction of the semiconductor device 1100 is increased, the light extraction efficiency can be improved and the luminous intensity Po can be increased.

In addition, when viewed from above the semiconductor device, the sum of the area of the first bonding pad 1171 and the area of the second bonding pad 1172 may be provided equal to or larger than 30% of the total area of the semiconductor device 1100.

As described, the sum of the areas of the first bonding pad 1171 and the second bonding pad 1172 is provided equal to or greater than 30% of the total area of the semiconductor device 1100, so that stable mounting can be performed through the first bonding pad 1171 and the second bonding pad 1172, and the electrical characteristics of the semiconductor device 1100 can be ensured not to deteriorate.

In the semiconductor device 1100 according to the embodiment, the total area of the first bonding pad 1171 and the second bonding pad 1172 may be selected to be 30% or more and 60% or less of the total area of the semiconductor device 1100, in consideration of the light extraction efficiency and stability of bonding, and ensuring electrical characteristics.

That is, when the sum of the areas of the first bonding pad 1171 and the second bonding pad 1172 is 30% or more to 100% or less of the total area of the semiconductor device 1100, the electrical characteristics of the semiconductor device 1100 can be ensured, and the bonding force to be mounted on the semiconductor device package can be ensured and stable mounting can be performed.

In addition, when the sum of the areas of the first bonding pad 1171 and the second bonding pad 1172 is more than 0% and not more than 60% of the total area of the semiconductor device 1100, the light extraction efficiency of the semiconductor device 1100 can be improved and the light intensity Po can be increased by increasing the amount of light emitted to the surface on which the first bonding pad 1171 and the second bonding pad 1172 are disposed.

According to the embodiment, in order to secure the electrical characteristics of the semiconductor device 1100 and the bonding force to be mounted on the semiconductor device package, and to increase the luminous intensity, the sum of the area of the first bonding pad 1171 and the area of the second bonding pad 1172 is selected to be not less than 30% and not more than 60% of the total area of the semiconductor device 1100.

In addition, according to another embodiment, it is not limited above, in order to secure the electrical characteristics and bonding force of the semiconductor device 1100, the sum of the areas of the first bonding pad 1171 and the second bonding pad 1172 may be more than 60% to less than 100%, and to increase the luminous intensity, the sum of the areas of the first bonding pad 1171 and the second bonding pad 1172 may be selected to be more than 0% and less than 30%.

According to the embodiment, the first bonding pad 1171 may be provided along the major axis direction of the semiconductor device 1100 at a length of x1 and be provided at a length of y1 along the minor axis direction of the semiconductor device 1100. At this time, the ratio of x1 and y1 may be provided, for example, in a range of 1:1.5 to 1:2.

In addition, the second bonding pad 1172 may be provided along the major axis direction of the semiconductor device 1100 at a length of x2 and may be provided along the minor axis direction of the semiconductor device 1100 at a length of y2. At this time, the ratio of x2 and y2 may be provided, for example, in a range of 1:1.5 to 1:2.

In addition, the minimum distance d between the first bonding pad 1171 and the second bonding pad 1172 may be provided to be equal to or greater than 125 micrometers. The minimum distance d between the first bonding pad 1171 and the second bonding pad 1172 may be selected by considering the interval between the second electrode pad and the first electrode pad of the package body on which the semiconductor device 1100 is configured to be mounted.

For example, the minimum distance between the first electrode pad and the second electrode pad of the package body may be provided at a minimum of 125 micrometers and may be provided at a maximum of 200 micrometers. In this case, considering the process error, the distance d between the first bonding pad 1171 and the second bonding pad 1172 may be provided to be 125 micrometers or more and 300 micrometers or less, for example.

In addition, when the distance d between the first bonding pad 1171 and the second bonding pad 1172 is greater than 125 micrometers, a minimum space can be ensured so that a short circuit does not occur between the first bonding pad 1171 and the second bonding pad 1172 of the semiconductor device, and the light emitting area for improving the light extraction efficiency can be ensured, so that the luminous intensity Po of the semiconductor device 1100 can be increased.

In addition, when the distance d between the first bonding pad 1171 and the second bonding pad 1172 is less than 300 micrometers, the first and second electrode pads of the semiconductor device package, and the first and second bonding pads 1171 and 1172 of the semiconductor device can be bonded with a sufficient bonding force and the electrical characteristics of the semiconductor device can be secured.

The minimum distance d between the first bonding pad 1171 and the second bonding pad 1172 may be greater than 125 micrometers in order to secure the optical characteristics and may be less than 300 micrometers in order to secure the reliability of the electrical characteristics and bonding force.

In the embodiment, the minimum distanced is provided in a range of 125 micrometers or more to 300 micrometers or less between the first bonding pad 1171 and the second bonding pad 1172, it is not limited above, the minimum distance can be provided to be 125 micrometers or less, in order to improve the electrical characteristics or reliability of the semiconductor device package, and can be provided to be 300 micrometers or more, in order to improve the optical characteristics of the semiconductor device package.

According to the embodiment, the first bonding pad 1171 may be spaced apart at a distance of b1 from the adjacent side surface disposed in the major axis direction of the semiconductor device 1100, and may be spaced apart at a distance of a1 or a3 from the adjacent side surface disposed in the minor axis direction of the semiconductor device 1100. In this case, a1 or a3 may be equal to or greater than 40 micrometers, for example, and b1 may be provided to be equal to or greater than 100 micrometers.

In addition, the second bonding pad 1172 may be space apart at a distance b2 from the adjacent side surface of the semiconductor device 1100 in the major axis direction of the semiconductor device 1100, and may be spaced apart at a distance of a2 or a4 from the adjacent side surface disposed in the minor axis direction of the semiconductor device 1100. In this case, a2 or a4 may be equal to or greater than 40 micrometers, for example, and b2 may be provided to be equal to or greater than 100 micrometers According to the embodiment, a1, a2, a3, and a4 may be provided with the same value. In addition, b1 and b2 may be provided with the same value. Also, according to another embodiment, at least two of a1, a2, a3 and a4 may have different values, and b1 and b2 may have different values.

In addition, according to the semiconductor device 1100 of the embodiment, as shown in FIG. 22, the third reflective layer 1163 may be disposed between the first bonding pad 1171 and the second bonding pad 1172. For example, the length d of the third reflective layer 1163 along the major axis direction of the semiconductor device 1100 may correspond to the distance between the first bonding pad 1171 and the second bonding pad 1172. Also, the third reflective layer 1163 may be provided at a length of along the minor axis direction of the semiconductor device 1100. The length f of the third reflective layer 1163 along the minor axis direction of the semiconductor device 1100 may correspond to the minor axis length of the semiconductor device 1100, for example. In addition, the area of the third reflective layer 1163 may be 10% or more and 25% or less of the entire upper surface of the semiconductor device 1100, for example.

When the area of the third reflective layer 1163 is 10% or more of the entire upper surface of the semiconductor device 1100, the package body disposed under the semiconductor device can be prevented from discoloration or cracking, and when the area of the third reflective layer 1163 is 25% or less, it is advantageous to secure the light extraction efficiency to emit light to the six surfaces of the semiconductor device.

In addition, in other embodiments it is not limited thereto, the area of the third reflective layer 1163 may be set to more than 0% and less than 10% of the entire upper surface of the semiconductor device 1100 in order to secure a larger light extraction efficiency, and the area of the third reflective layer 1163 may be set to more than 25% and less than 100% of the entire upper surface of the semiconductor device 100 in order to prevent discoloration or cracking in the package body.

According to the semiconductor device 1100 of the embodiment as described above, light generated in the light emitting structure 1110 is not transmitted through the first region provided between the first bonding pad 1171 and the second bonding pad 1172. Here, the first region may be a region corresponding to a minimum gap between the first bonding pad 1171 and the second bonding pad 1172. Also, the first region may correspond to the length d of the third reflective layer 1163 disposed in the major axis direction of the semiconductor device.

In addition, the light generated in the light emitting structure 1100 may be transmitted and emitted through the second region provided between the side surface of the semiconductor device 1100 disposed in the major axis direction and the neighboring first bonding pad 1171 or the second bonding pad 1172. At this time, the second region may be a region corresponding to b1 and b2.

Further, the light generated in the light emitting structure may be transmitted and emitted through the third region provided between the side surface of the semiconductor device 1100 disposed in the minor axis direction and the neighboring first bonding pad 1171 or the second bonding pad 1172. At this time, the third region may be a region corresponding to a1, a2, a3, and a4.

For example, in the case where the length in the major axis of the semiconductor device 1100 according to the embodiment is 1250 mm and the length in the minor axis length is 750 mm, the above mentioned variables may have the following values.

When the area of the first bonding pad 1171 and the area of the second bonding pad 1172 are equal to each other and the sum is 30%, if x1:y1=1:2 and the value of d is provided of 125 micrometers, the value of x1 may be provided of 265 micrometers, and the value of y1 may be provided of 530 micrometers. Thus, the value of a1 may be less than or equal to 110 micrometers for example, and the value of b1 may be provided as less than or equal to 300 micrometers as an example.

That is, the sum of the area of the first bonding pad 1171 and the area of the second bonding pad 1172 is determined according to the size of the semiconductor device 1100, once the ratio of width and length, and the value of d are determined, the remaining variables can be calculated. Accordingly, the upper limit values of a1, a2, a3, a4, b1, b2, and the like are not indicated.

According to the embodiment, the size of the first reflective layer 1161 may be provided of several micrometers larger than the size of the first bonding pad 1171. For example, the area of the first reflective layer 1161 may be provided in such a size that the area of the first bonding pad 1171 can be completely covered. The length of one side of the first reflective layer 1161 may be provide of about 4 micrometers to about 10 micrometers larger than the length of one side of the first bonding pad 1171, for example, in consideration of a process error.

In addition, the size of the second reflective layer 1162 may be provided of several micrometers larger than the size of the second bonding pad 1172. For example, the area of the second reflective layer 1162 may be provided in such a size that the area of the second bonding pad 1172 can be completely covered. The length of one side of the second reflective layer 1162 may be provided of about 4 micrometers to about 10 micrometers larger than the length of one side of the second bonding pad 1172, for example, in consideration of a process error.

According to the embodiment, the first reflective layer 1161 and the second reflective layer 1162 allow light emitted from the light emitting structure 1110 to be reflected without being incident on the first bonding pad 1171 and the second bonding pad 1172. Accordingly, loss of light generated and emitted from the light emitting structure 1110 can be minimized by being incident on the first bonding pad 1171 and the second bonding pad 1172.

In addition, according to the semiconductor device 1100 of the embodiment, since the third reflective layer 1163 is disposed between the first bonding pad 1171 and the second bonding pad 1172, it is possible to prevent light from being emitted between the first bonding pad 1171 and the second bonding pad 1172.

As described above, the semiconductor device 1100 according to the embodiment can be mounted, for example, in a flip chip bonding manner and provided in the form of a semiconductor device package. At this time, when the package body on which the semiconductor device 1100 is mounted is provided by resin or the like, the package body can be discolored or cracked due to strong short wavelength light emitted from the semiconductor device 1100, in the region under the semiconductor device 1100.

However, according to the semiconductor device 1100 of the embodiment, since light can be prevented from being emitted between the regions where the first bonding pad 1171 and the second bonding pad 1172 are disposed, the package body disposed under the semiconductor device 1100 can be prevented from being discolored or cracked.

In addition, according to the semiconductor device 1100 of the embodiment, the minimum distance between the first electrode pad and the second electrode pad provided in the package body is considered, so that the width d of the third reflective layer 1163 can be selected as minimized. By maximally ensuring the spacing b1 and b2 provided between the first bonding pad 1171 or the second bonding pad 1172 adjacent to the side surface of the semiconductor device 1100 in the major axis direction, the amount of light emitted to the sides of the first bonding pad 1171 and the second bonding pad 1172 can be improved.

According to the embodiment, light generated in the light emitting structure 1110 can be transmitted and emitted in an area of 20% or more of the upper surface of the semiconductor device 1100 on which the first bonding pad 1171, the second bonding pad 1172, and the third reflective layer 1163 are disposed.

Accordingly, according to the embodiment, since the amount of light emitted in the six surface direction of the semiconductor device 1100 is increased, the light extraction efficiency can be improved and the luminous intensity Po can be increased. In addition, it is possible to prevent the package body disposed close to the lower surface of the semiconductor device 100 from being discolored or cracked.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

DESCRIPTION OF SYMBOLS

100, 500 Semiconductor device
110, 510 Semiconductor layer
115 First bonding layer
120, 520 Metal layer
130, 530 Porous metal layer
135 Alloy layer
140, 540 Bonding metal layer
200, 400, 600, 700 Semiconductor device package
210, 410 Pad unit
220, 420 Lead frame
230, 430 Package body
240, 440 Molding unit
300 Main board
310 Second bonding layer
535 Bonding alloy layer

INDUSTRIAL APPLICABILITY

According to the semiconductor device, the method of manufacturing the semiconductor device, the semiconductor device package, and the method of manufacturing the semiconductor device package of the embodiments, there is an advantage that stable bonding can be performed by providing a small pressure at a low temperature.

According to the semiconductor device, the method of manufacturing the semiconductor device, the semiconductor device package, and the method of manufacturing the semiconductor device package of the embodiments, there is an advantage that it is capable of preventing a re-melting phenomenon from occurring in a bonding region of a semiconductor device package in a process of re-bonding the semiconductor device package to a substrate or the like.

The invention claimed is:

1. A semiconductor device, comprising:
a light emitting structure comprising a first conductivity type semiconductor layer, a second conductivity type semiconductor layer, and an active layer disposed between the first conductivity type semiconductor layer and the second conductivity type semiconductor layer;
a first bonding pad disposed on the light emitting structure and electrically connected to the first conductivity type semiconductor layer; and
a second bonding pad disposed on the light emitting structure and spaced apart from the first bonding pad, and electrically connected to the second conductivity type semiconductor layer,
wherein each of the first bonding pad and the second bonding pad comprises a porous metal layer comprising a plurality of pores and a bonding alloy layer disposed on the porous metal layer, wherein the bonding alloy layer comprises an alloy layer comprising Au and Sn, wherein, with reference to a Au atomic composition ratio in the alloy layer disposed in a first region that is closer to the porous metal layer, a Au atomic composition ratio in the alloy layer disposed in a second region that is relatively far from the porous metal layer with reference to the first region is smaller, wherein, in the alloy layer disposed in the first region, the Au atomic composition ratio is 25 at % or more and 50 at % or less, and a Sn atomic composition ratio is 50 at % or more and 75 at % or less, and wherein, in the alloy layer disposed in the second region, the Au atomic composition ratio is 5 at % or more and 25 at % or less, and a Sn atomic composition ratio is 75 at % or more and 95 at % or less.

2. The semiconductor device according to claim 1, wherein the porous metal layer comprises at least one selected from a group including Au, Ag, and Cu, or an alloy thereof.

3. The semiconductor device according to claim 1, further comprising a reflective layer disposed on the light emitting structure and disposed between the first bonding pad and the second bonding pad, wherein a sum of an area of the first bonding pad and an area of the second bonding pad, when viewed from a top of the semiconductor device, is equal to or smaller than 60% of a total area of an upper surface of the semiconductor device on which the first bonding pad and the second bonding pad are disposed, wherein an area of the reflective layer is provided not less than 10% and not more than 25% of the total area of the upper surface of the semiconductor device, wherein light generated in the light emitting structure is not transmitted and emitted through a first region provided between the first bonding pad and the second bonding pad, and wherein the light generated in the light emitting structure is transmitted and emitted through a second region and a third region, the second region provided between side surfaces of the semiconductor device in a major axis direction and the first bonding pad or the second bonding pad which are adjacent to the side surfaces, and the third region provided between side surfaces of the semiconductor device in a minor axis direction and the first bonding pad or the second bonding pad which are adjacent to the side surfaces.

4. The semiconductor device according to claim 1, wherein a sum of an area of the first bonding pad and an area of the second bonding pad is greater than or equal to 30% of a total area of the semiconductor device, when viewed from a top of the semiconductor device.

5. The semiconductor device according to claim 1, wherein the first bonding pad or the second bonding pad is provided along a major axis direction of the semiconductor device at a length of x and is provided along a minor axis direction of the semiconductor device at a length of y, and wherein a ratio of x and y is provided in a range of 1:1.5 to 1:2.

6. The semiconductor device according to claim 1, wherein a distance between the first bonding pad and the second bonding pad is equal to or greater than 125 micrometers and equal to or less than 300 micrometers.

7. A semiconductor device package, comprising:

a package body providing a recess and comprising a pad unit provided on a bottom surface of the recess;

a bonding alloy layer disposed in the recess and disposed on the pad unit;

a porous metal layer disposed on the bonding alloy layer and comprising a plurality of pores;

a metal layer disposed on the porous metal layer; and a semiconductor layer disposed on the metal layer, wherein the bonding alloy layer comprises an alloy layer comprising Au and Sn, and wherein, with reference to a Au atomic composition ratio in the alloy layer disposed in a first region that is closer to the porous metal layer, a Au atomic composition ratio in the alloy layer disposed in a second region that is far from the porous metal layer is smaller, wherein, in the alloy layer disposed in the first region, the Au atomic composition ratio is 25 at % or more and 50 at % or less, and a Sn atomic composition ratio is 50 at % or more and 75 at % or less, and wherein, in the alloy layer disposed in the second region, the Au atomic composition ratio is 5 at % or more and 25 at % or less, and a Sn atomic composition ratio is 75 at % or more and 95 at % or less.

8. The semiconductor device package according to claim 7, wherein the porous metal layer comprises at least one selected from a group including Au, Ag, and Cu, or an alloy thereof.

9. A semiconductor device package, comprising:

a package body providing a recess and comprising a pad unit provided on a bottom surface of the recess; and the semiconductor device according to claim 1 that is disposed in the recess and electrically connected to the pad unit.

10. The semiconductor device package according to claim 9, wherein the porous metal layer comprises at least one selected from a group including Au, Ag, and Cu, or an alloy thereof.

11. The semiconductor device package according to claim 9, further comprising a reflective layer disposed on the light emitting structure and disposed between the first bonding pad and the second bonding pad, wherein a sum of an area of the first bonding pad and an area of the second bonding pad, when viewed from a top of the semiconductor device, is equal to or smaller than 60% of a total area of an upper surface of the semiconductor device on which the first bonding pad and the second bonding pad are disposed, wherein an area of the reflective layer is provided not less than 10% and not more than 25% of the total area of the upper surface of the semiconductor device, wherein light generated in the light emitting structure is not transmitted and emitted through a first region provided between the first bonding pad and the second bonding pad, and wherein the light generated in the light emitting structure is transmitted and emitted through a second region and a third region, the second region provided between side surfaces of the semiconductor device in a major axis direction and the first bonding pad or the second bonding pad which are adjacent to the side surfaces, and the third region provided between side surfaces of the semiconductor device in a minor axis direction and the first bonding pad or the second bonding pad which are adjacent to the side surfaces.

12. The semiconductor device package according to claim 9, wherein a sum of an area of the first bonding pad and an area of the second bonding pad is greater than or equal to 30% of a total area of the semiconductor device, when viewed from a top of the semiconductor device.

13. The semiconductor device package according to claim 9, wherein the first bonding pad or the second bonding pad is provided along a major axis direction of the semiconductor device at a length of x and is provided along a minor axis direction of the semiconductor device at a length of y,
   wherein a ratio of x and y is provided in a range of 1:1.5 to 1:2, and
   wherein a distance between the first bonding pad and the second bonding pad is equal to or greater than 125 micrometers and equal to or less than 300 micrometers.

* * * * *